US012317517B2

(12) United States Patent
Su et al.

(10) Patent No.: US 12,317,517 B2
(45) Date of Patent: May 27, 2025

(54) SEMICONDUCTOR DIE PACKAGE AND METHODS OF FORMATION

(71) Applicant: Taiwan Semiconductor Manufacturing Company, Ltd., Hsinchu (TW)

(72) Inventors: Shu-Hui Su, Tucheng (TW); Hsin-Li Cheng, Hsin Chu (TW); YingKit Felix Tsui, Cupertino, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 240 days.

(21) Appl. No.: 18/151,059

(22) Filed: Jan. 6, 2023

(65) Prior Publication Data

US 2024/0113159 A1 Apr. 4, 2024

Related U.S. Application Data

(60) Provisional application No. 63/377,648, filed on Sep. 29, 2022.

(51) Int. Cl.

| | |
|---|---|
| ***H01L 23/522*** | (2006.01) |
| ***H01L 23/00*** | (2006.01) |
| ***H01L 23/60*** | (2006.01) |
| ***H01L 25/16*** | (2023.01) |
| ***H10D 1/00*** | (2025.01) |
| ***H10D 1/68*** | (2025.01) |
| ***H10D 80/30*** | (2025.01) |

(52) U.S. Cl.
CPC ......... *H10D 1/042* (2025.01); *H01L 23/5223* (2013.01); *H01L 23/60* (2013.01); *H01L 24/04* (2013.01); *H01L 24/80* (2013.01); *H10D 1/716* (2025.01); *H01L 2224/04105* (2013.01); *H01L 2224/80895* (2013.01); *H01L 2924/19041* (2013.01)

(58) Field of Classification Search
CPC ..... H01L 23/5223; H01L 23/60; H01L 25/16; H01L 25/50; H01L 24/04; H01L 24/08; H01L 24/80; H10D 1/042; H10D 1/716; H10D 80/30
See application file for complete search history.

(56) References Cited

U.S. PATENT DOCUMENTS 8,912,065 B2 12/2014 Wu et al.
11,195,958 B2 12/2021 Hu et al.
(Continued)

FOREIGN PATENT DOCUMENTS

CN 112840450 A 5/2021
TW 201351478 A 12/2013

*Primary Examiner* — Omar F Mojaddedi
(74) *Attorney, Agent, or Firm* — Harrity & Harrity, LLP

(57) ABSTRACT

A semiconductor die included in a semiconductor die package may include a plurality of decoupling trench capacitor regions in a device region of the semiconductor die. At least two or more of the decoupling trench capacitor regions include decoupling trench capacitor structures having different depths. The depths of the decoupling trench capacitor structures in the decoupling trench capacitor regions may be selected to provide sufficient capacitance so as to satisfy circuit decoupling parameters for circuits of the semiconductor die package, while reducing the likelihood of warping, breaking, and/or cracking of the semiconductor die package.

20 Claims, 36 Drawing Sheets

(56) References Cited

U.S. PATENT DOCUMENTS

| | | | | |
|---|---|---|---|---|
| 2013/0161792 | A1* | 6/2013 | Tran | H10D 1/62<br>438/386 |
| 2016/0172314 | A1* | 6/2016 | Cheng | H01L 23/564<br>257/509 |
| 2018/0076277 | A1* | 3/2018 | Hu | H01L 28/40 |
| 2018/0130869 | A1* | 5/2018 | Hu | H10D 1/68 |
| 2020/0212229 | A1* | 7/2020 | Hu | H10D 62/116 |
| 2020/0411636 | A1 | 12/2020 | Kao et al. | |
| 2021/0090983 | A1* | 3/2021 | Lin | H01L 25/50 |
| 2022/0115358 | A1 | 4/2022 | Huang et al. | |

* cited by examiner

SEMICONDUCTOR DIE PACKAGE AND METHODS OF FORMATION

CROSS-REFERENCE TO RELATED APPLICATION

This Patent application claims priority to U.S. Provisional Patent Application No. 63/377,648, filed on Sep. 29, 2022, and entitled "SEMICONDUCTOR DIE PACKAGE AND METHODS OF FORMATION." The disclosure of the prior Application is considered part of and is incorporated by reference into this Patent Application.

BACKGROUND

Various semiconductor device packing techniques may be used to incorporate one or more semiconductor dies into a semiconductor device package. In some cases, semiconductor dies may be stacked in a semiconductor device package to achieve a smaller horizontal or lateral footprint of the semiconductor device package and/or to increase the density of the semiconductor device package. Semiconductor device packing techniques that may be performed to integrate a plurality of semiconductor dies in a semiconductor device package may include integrated fanout (InFO), package on package (PoP), chip on wafer (CoW), wafer on wafer (WoW), and/or chip on wafer on substrate (CoWoS), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
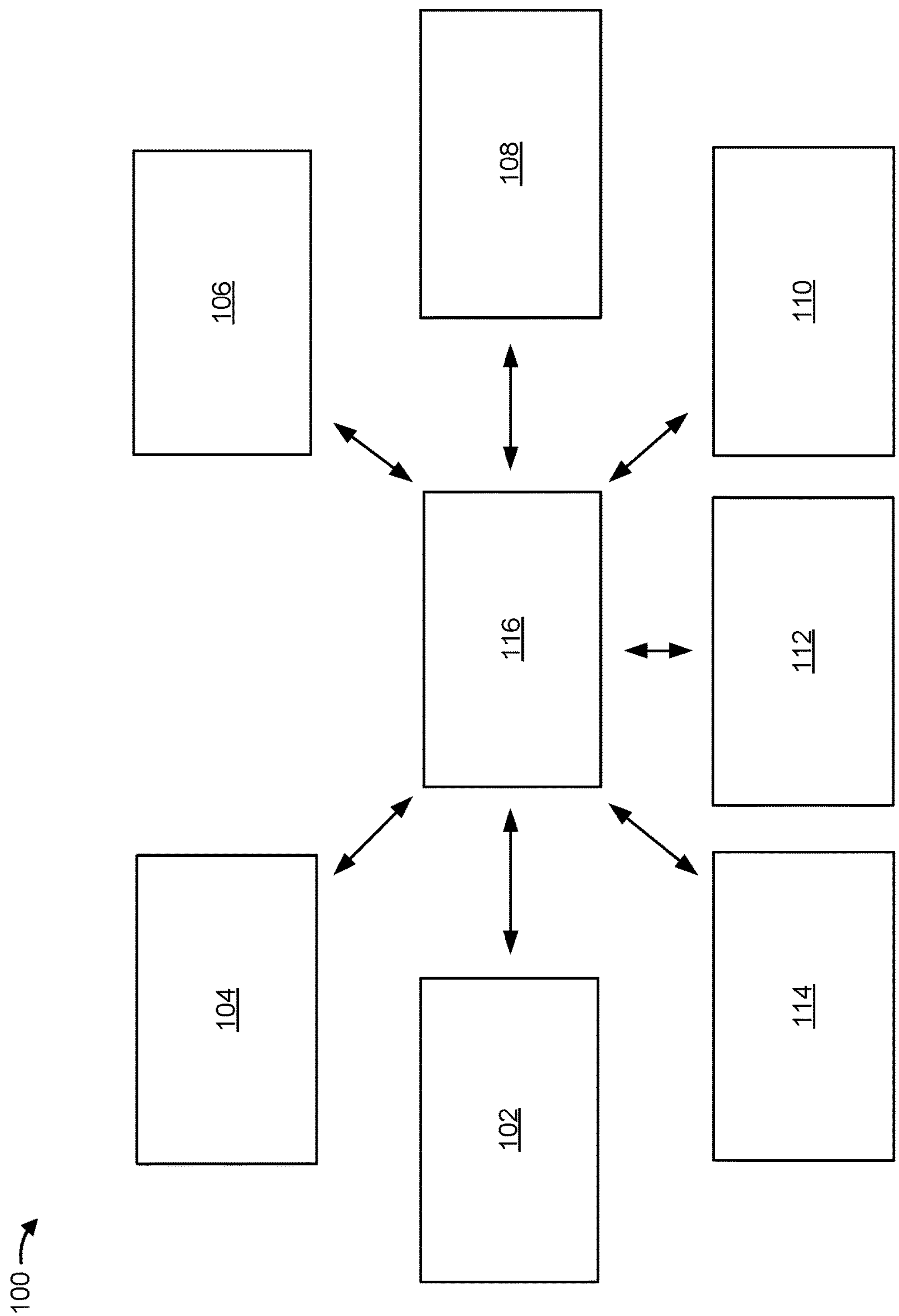
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a wafer on wafer (WoW) semiconductor die package, semiconductor dies are directly bonded such that the semiconductor dies are vertically arranged in the WoW semiconductor die package. The use of direct bonding and vertical stacking of dies may reduce interconnect lengths between the semiconductor dies (which reduces power loss and signal propagation times) and may enable increased density of semiconductor die packages in a semiconductor device package that includes the WoW semiconductor die package.

In some cases, decoupling trench capacitors may be included in one or more semiconductor dies in a WoW semiconductor die package. The decoupling trench capacitors, which may be implemented as deep trench capacitor (DTC) structures, may be included to decouple various circuits in the one or more semiconductor dies. In particular, the decoupling trench capacitors may provide noise decoupling by shunting noise (e.g., voltage spikes, voltage swings) from a circuit in the one or more semiconductor dies, thereby preventing the noise from affecting other circuits in the one or more semiconductor dies.

Decoupling trench capacitors may be formed in a semiconductor substrate in a device region of a semiconductor die included in a WoW semiconductor die package. The quantity, density, and/or depth of decoupling trench capacitors may be increased in the semiconductor substrate to increase the amount of decoupling capacitance provided for the circuits of the WoW semiconductor die package. However, increasing the quantity, density, and/or depth of the decoupling trench capacitors may result in increased physical stress in the semiconductor die, which may increase the likelihood of cracking, warpage, and/or device failures in the semiconductor die.

During fabrication of the decoupling trench capacitors, an etch process is performed to remove portions of the semiconductor substrate to form a plurality of trenches for the decoupling trench capacitors. The etch process may be performed such that the sidewalls of the trenches are substantially straight and vertical in the semiconductor substrate, and such that the trenches have a relatively high aspect ratio (e.g., a ratio of the depth to the width of the semiconductor substrate). Deposition processes are performed to form a plurality of electrodes and dielectric layers within the trenches such that the electrodes and dielectric layers completely fill each of the trenches.

However, during the fabrication process and/or during operation of the decoupling trench capacitors, the electrodes and dielectric layers are exposed to heat (e.g., due to baking process(es) and/or heat generated by high voltages and/or currents). The heat may cause the dielectric layers and/or the electrodes to undergo thermal expansion, which results in forces being applied to the sidewalls of the trenches. The deeper the trenches are, and/or the greater the density of the decoupling (and therefore the greater the density of the trenches), the more likely that these forces may cause warping, breaking, and/or cracking of the semiconductor die.

In some implementations described herein, a semiconductor die included in a semiconductor die package may include a plurality of decoupling trench capacitor regions in a device region of the semiconductor die. At least two or more of the decoupling trench capacitor regions include decoupling trench capacitor structures having different depths. The depths of the decoupling trench capacitor structures in the decoupling trench capacitor regions may be selected to provide sufficient capacitance so as to satisfy circuit decoupling parameters for circuits of the semiconductor die package, while reducing the likelihood of warping, breaking, and/or cracking of the semiconductor die package.

In this way, the performance of the circuits of the semiconductor die package may be increased while reducing the likelihood of failures in the semiconductor die package that might otherwise be caused by warping, breaking, and/or cracking of the semiconductor die package. This may reduce the likelihood of that the semiconductor die package may have to be reworked and/or scrapped, which may reduce processing times and/or increase the yield of semiconductor substrates including the decoupling trench capacitor structures described herein.

FIG. 1 is a diagram of an example environment 100 in which systems and/or methods described herein may be implemented. As shown in FIG. 1, the example environment 100 may include a plurality of semiconductor processing tools 102-114 and a wafer/die transport tool 116. The plurality of semiconductor processing tools 102-112 may include a deposition tool 102, an exposure tool 104, a developer tool 106, an etch tool 108, a planarization tool 110, a plating tool 112, a bonding tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The bonding tool 114 is a semiconductor processing tool that is capable of bonding two or more work pieces (e.g., two or more semiconductor substrates, two or more semiconductor devices, two or more semiconductor dies) together. For example, the bonding tool 114 may be a direct bonding tool that is a type of bonding tool that is configured to bond semiconductor dies together directly through copper-to-copper (or other direct metal) connections. As another example, the bonding tool 114 may include a eutectic bonding tool that is capable of forming a eutectic bond between two or more wafers together. In these examples, the bonding tool 114 may heat the two or more wafers to form a eutectic system between the materials of the two or more wafers.

Wafer/die transport tool 116 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-114, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 116 may be a programmed device that is configured to travel a particular path and/or may operate semi-autonomously or autonomously. In some implementations, the example environment 100 includes a plurality of wafer/die transport tools 116.

For example, the wafer/die transport tool 116 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 116 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 116 is configured to transport substrates and/or semiconductor devices between the processing chambers of the deposition tool 102 without breaking or removing a vacuum (or an at least partial vacuum) between the processing chambers and/or between processing operations in the deposition tool 102.

In some implementations, one or more of the semiconductor processing tools 102-116 and/or the wafer/die transport tool 116 may perform one or more semiconductor processing operations described herein. For example, one or more of the semiconductor processing tools 102-114 and/or the wafer/die transport tool 116 may form a plurality of decoupling trench capacitor regions in a device region of a first semiconductor die structure, where a first plurality of decoupling trench capacitor structures, of a first decoupling trench capacitor region of the plurality of decoupling trench capacitor regions, are formed to a first depth in the device region, and where a second plurality of decoupling trench capacitor structures, of a second decoupling trench capacitor region of the plurality of decoupling trench capacitor regions, are formed to a second depth in the device region, and where the first depth and the second depth are different depths relative to a surface of the device region; may form an interconnect region over the device region after forming the plurality of decoupling trench capacitor regions; and/or may bond a first semiconductor die with a second semiconductor die at a bonding interface.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2A:
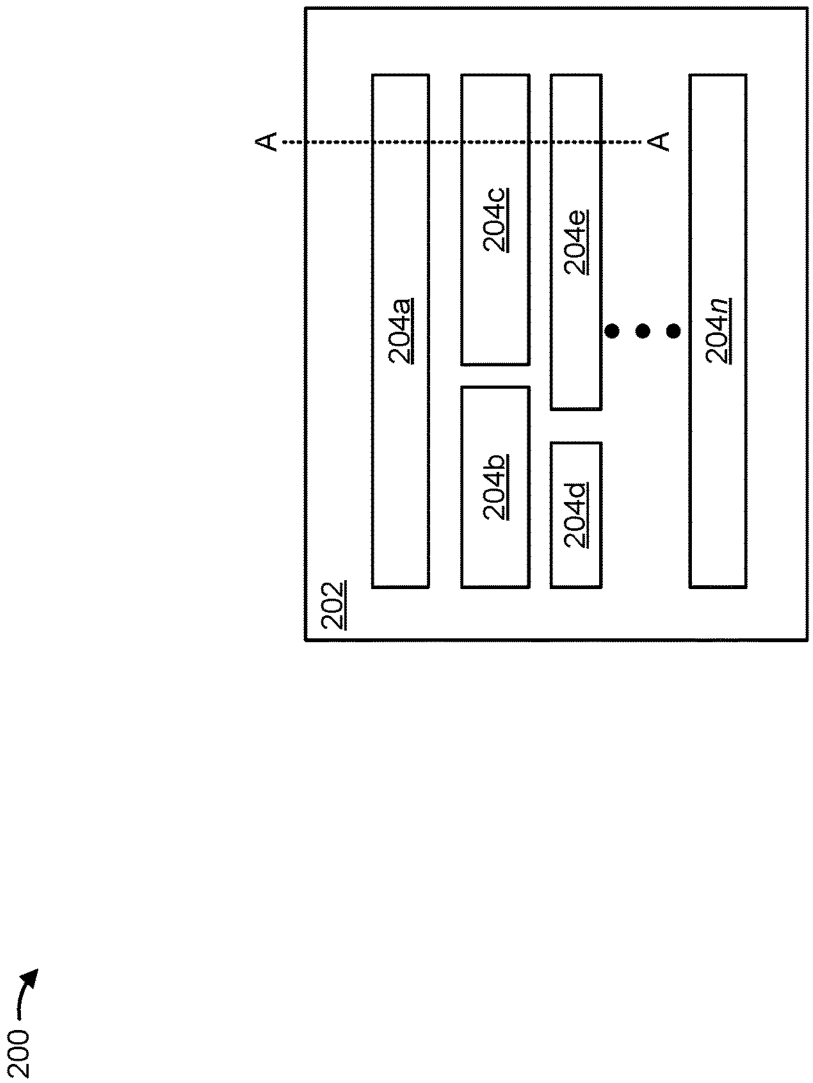
FIGS. 2A-2C are diagrams of an example semiconductor die package described herein.
Figure 2B:
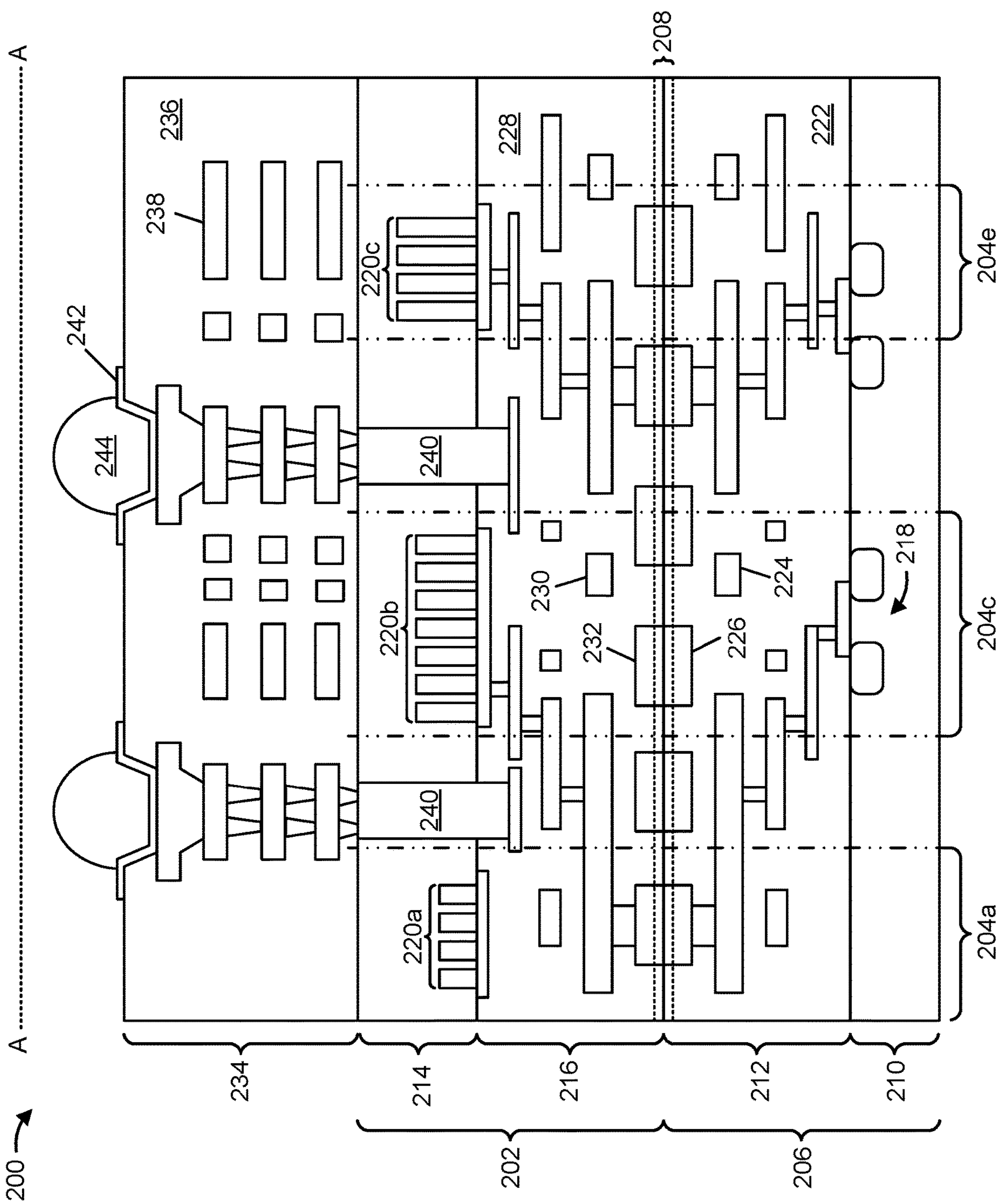
Figure 2C:
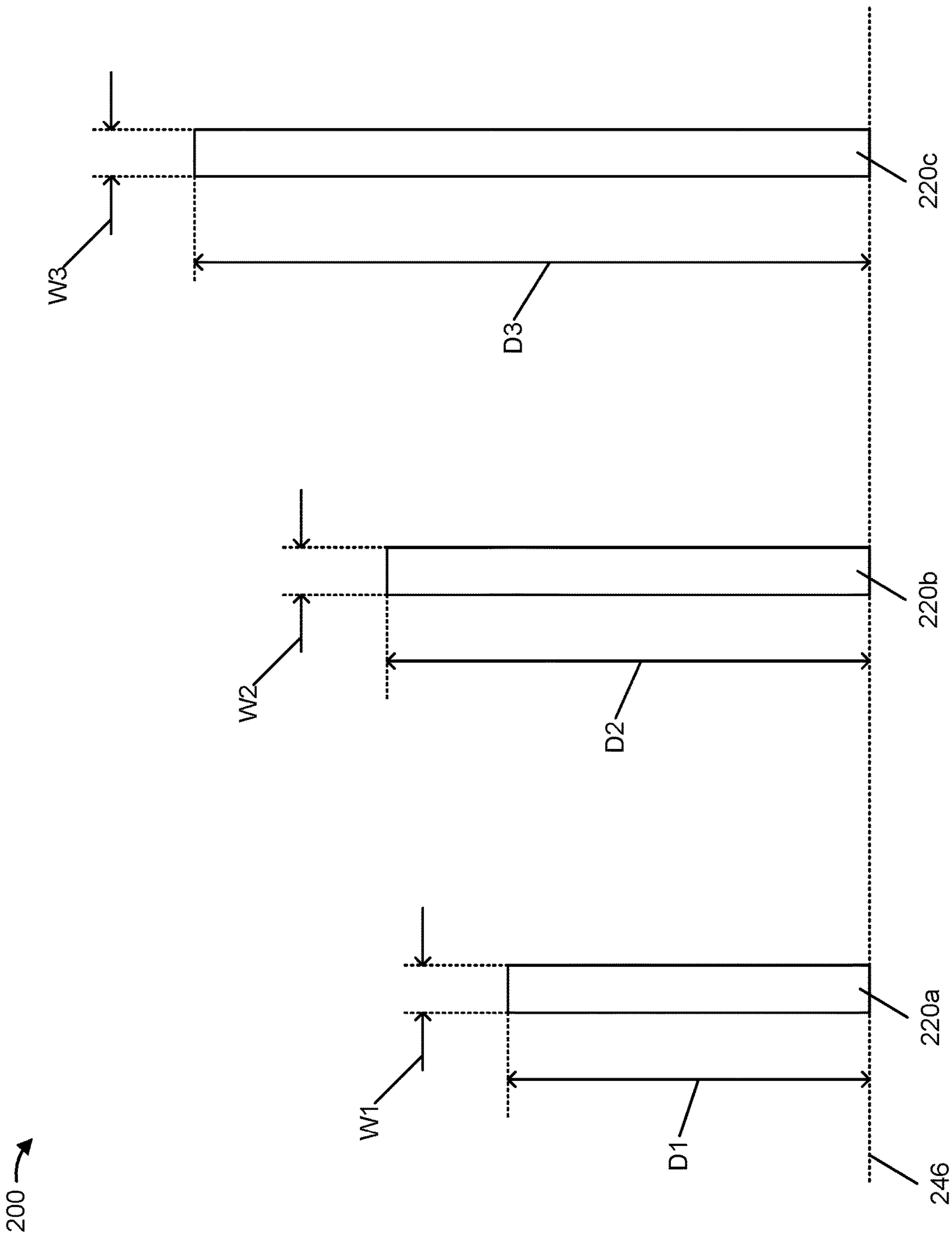

FIGS. 2A-2C are diagrams of an example semiconductor die package 200 described herein. The semiconductor die package 200 includes an example of a wafer on wafer (WoW) semiconductor die package, a die on wafer semiconductor die package, a die on die semiconductor die package, or another type of semiconductor die package in which semiconductor dies are directly bonded and vertically arranged or stacked. FIG. 2A illustrates a top-down view of a portion of the semiconductor die package 200. FIG. 2B illustrates a cross-section view of a portion of the semiconductor die package 200 along line A-A in FIG. 2A. FIG. 2C illustrates dimensions of decoupling trench capacitor structures included in the semiconductor die package 200.

As shown in FIG. 2A, the semiconductor die package 200 may include a first semiconductor die 202 and a plurality of decoupling trench capacitor regions **204*a*-204*n* in the first semiconductor die 202. The decoupling trench capacitor regions 204*a*-204*n* may be horizontally arranged in the first semiconductor die 202. The decoupling trench capacitor regions 204*a*-204*n* may include various sizes and/or shapes to provide a sufficient amount of decoupling capacitance across the semiconductor die package 200 for the circuits and semiconductor devices of the semiconductor die package 200**.

As shown in FIG. 2B, the semiconductor die package 200 includes the first semiconductor die 202 and a second semiconductor die 206. In some implementations, the semiconductor die package 200 includes additional semiconductor dies. The first semiconductor die 202 may include an SoC die, such as a logic die, a central processing unit (CPU) die, a graphics processing unit (GPU) die, a digital signal processing (DSP) die, an application specific integrated circuit (ASIC) die, and/or another type of SoC die. Additionally and/or alternatively, the first semiconductor die 202 may include a memory die, an input/output (I/O) die, a pixel sensor die, and/or another type of semiconductor die. A memory die may include a static random access memory (SRAM) die, a dynamic random access memory (DRAM) die, a NAND die, a high bandwidth memory (HBM) die, and/or another type of memory die. The second semiconductor die 206 may include the same type of semiconductor die as the first semiconductor die 202, or may include a different type of semiconductor die.

The first semiconductor die 202 and the second semiconductor die 206 may be bonded together (e.g., directly bonded) at a bonding interface 208. In some implementations, one or more layers may be included between the first semiconductor die 202 and the second semiconductor die 206 at the bonding interface 208, such as one or more passivation layers, one or more bonding films, and/or one or more layers of another type.

The second semiconductor die 206 may include a device region 210 and an interconnect region 212 adjacent to and/or above the device region 210. In some implementations, the second semiconductor die 206 may include additional regions. Similarly, the first semiconductor die 202 may include a device region 214 and an interconnect region 216 adjacent to and/or below the device region 214. In some implementations, the first semiconductor die 202 may include additional regions. The first semiconductor die 202 and the second semiconductor die 206 may be bonded at the interconnect region 212 and the interconnect region 216. The bonding interface 208 may be located at a first side of the interconnect region 216 facing the interconnect region 212 and corresponding to a first side of the second semiconductor die 202.

The device regions 210 and 214 may each include a semiconductor substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, a silicon carbide (SiC) substrate, or another type of semiconductor substrate. The device region 210 of the second semiconductor die 206 may include one or more semiconductor devices 218 included in the semiconductor substrate of the device region 210. The semiconductor devices 218 may include one or more transistors (e.g., planar transistors, fin field effect transistors (FinFETs), nanosheet transistors (e.g., gate all around (GAA) transistors), memory cells, capacitors, inductors, resistors, pixel sensors, circuits (e.g., integrated circuits (ICs)), and/or another type of semiconductor devices.

As further shown in FIG. 2B, the device region 210 of the first semiconductor die 202 may include a plurality of decoupling trench capacitor structures 220*a*-220*c* in the semiconductor substrate of the device region 214. Respective pluralities of the decoupling trench capacitor structures 220*a*-220*c* may be included in different decoupling trench capacitor regions in the device region 214. For example, the decoupling trench capacitor structures 220*a* may be included in the decoupling trench capacitor region 204*a*, the decoupling trench capacitor structures 220*b* may be included in the decoupling trench capacitor region 204*c*, the decoupling trench capacitor structures 220*c* may be included in the decoupling trench capacitor region 204*e*, and so on. The decoupling trench capacitor structures 220*a*-220*c* may be configured to provide a decoupling capacitance for the one or more semiconductor devices 218 of the second semiconductor die 206.

At least two or more of the respective pluralities of decoupling trench capacitor structures 220*a*-220*c* may be formed to different depths (or heights) in the device region 214 relative to a surface (e.g., the bottom surface) of the semiconductor substrate of the device region 214. For example, a depth (or height) of the decoupling trench capacitor structures 220*b* in the decoupling trench capacitor region 204*c* may be greater relative to a depth (or height) of the decoupling trench capacitor structures 220*a* in the decoupling trench capacitor region 204*a*. As another example, a depth (or height) of the decoupling trench capacitor structures 220*c* in the decoupling trench capacitor region 204*e* may be greater relative to the depth (or height) of the decoupling trench capacitor structures 220*c* in the decoupling trench capacitor region 204*c*, and may be greater relative to the depth (or height) of the decoupling trench capacitor structures 220*a* in the decoupling trench capacitor region 204*a*. In some implementations, the decoupling trench capacitor structures included in the same decoupling trench capacitor region may be formed to the same depth (or the same height). In some implementations, two or more decoupling trench capacitor structures included in the same decoupling trench capacitor region may be formed to different depths (or different heights).

The depths of the decoupling trench capacitor structures 220*a*-220*c* (and other decoupling trench capacitor structures in the decoupling trench capacitor regions 204*a*-204*n*) may be selected to provide sufficient capacitance so as to satisfy circuit decoupling parameters for the semiconductor devices 218 included in circuits of the semiconductor die package 200, while reducing the likelihood of warping, breaking, and/or cracking of the semiconductor die package 200. Some of the circuits of the semiconductor die package 200 may have greater decoupling capacitance requirements than other circuits in order to properly operate at desired performance parameters. Accordingly, deeper decoupling trench capacitor structures may be formed for these circuits relative to the depth of decoupling trench capacitor structures that are formed for other circuits that have lesser decoupling capacitance requirements. This enables a balance between satisfying capacitance requirements in the semiconductor die package 200 and reducing the likelihood of warpage in the semiconductor die package 200.

Additionally and/or alternatively, the arrangement or layout of decoupling trench capacitor structure depths (or heights) across the semiconductor die package 200 may be determined or selected based on the overall floorplan of the first semiconductor die 202 and/or the second semiconductor die 206. For example, decoupling trench capacitor structures of greater depth (or greater height) may be included at or near an edge (e.g., an outer edge or an outer perimeter) of the first semiconductor die 202 and/or the second semiconductor die 206 to reduce the likelihood of warpage in the first semiconductor die 202 and/or the second semiconductor die 206. Decoupling trench capacitor structures of lesser depth (or lesser height) may be included closer to the center of the first semiconductor die 202 and/or the second semiconductor die 206. However, other arrangements of decoupling trench capacitor structure depths (or heights) across the semiconductor die package 200 may be selected to satisfy an equivalent series resistance (ESR) parameter for the interconnection regions 212 and 216, among other performance parameters.

Various design rules and/or principals may be employed when determining the arrangement or layout of decoupling trench capacitor structure depths (or heights) across the semiconductor die package 200. In some implementations, a target decoupling trench capacitor structure depth (or height) may be selected for the semiconductor die package 200, and the depths (or heights) of the decoupling trench capacitor structures across the semiconductor die package 200 may be selected within a particular range of the target decoupling trench capacitor structure depth (or height). As an example, a target decoupling trench capacitor structure depth (or height) may be selected for the semiconductor die package 200, and the depths (or heights) of the decoupling trench capacitor structures across the semiconductor die package 200 may be selected from a range of approximately +/−15% of the target decoupling trench capacitor structure depth (or height). However, other values for the range are within the scope of the present disclosure.

In some implementations, other parameters for the decoupling trench capacitor structures of the semiconductor die package 200 may be selected in a similar manner. For example, a target decoupling trench capacitor structure width (or critical dimension) may be selected for the semiconductor die package 200, and the widths (or critical dimensions) of the decoupling trench capacitor structures across the semiconductor die package 200 may be selected from a range of approximately +/−30% of the target decoupling trench capacitor structure depth (or height). However, other values for the range are within the scope of the present disclosure.

As another example, a target decoupling trench capacitor structure aspect ratio (e.g., a ratio of the height to the width) may be selected for the semiconductor die package 200, and the aspect ratios of the decoupling trench capacitor structures across the semiconductor die package 200 may be selected from a range of approximately +/−12% of the target decoupling trench capacitor structure depth (or height). However, other values for the range are within the scope of the present disclosure.

The interconnect regions 212 and 216 may be referred to as back end of line (BEOL) regions. The interconnect region 212 may include one or more dielectric layers 222, which may include a silicon nitride ($SiN_x$), an oxide (e.g., a silicon oxide ($SiO_x$) and/or another oxide material), a low dielectric constant (low-k) dielectric material, and/or another type of dielectric material. In some implementations, one or more etch stop layers (ESLs) may be included in between layers of the one or more dielectric layers 222. The one or more ESLs may include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$), among other examples.

The interconnect region 212 may further include metallization layers 224 in the one or more dielectric layers 222. The semiconductor devices 218 in the device region 210 may be electrically connected and/or physically connected with one or more of the metallization layers 224. The metallization layers 224 may include conductive lines, trenches, vias, pillars, interconnects, and/or another type of metallization layers. Contacts 226 may be included in the one or more dielectric layers 222 of the interconnect region 212. The contacts 226 may be electrically connected and/or physically connected with one or more of the metallization layers 224. The contacts 226 may include conductive terminals, conductive pads, conductive pillars, under bump metallization (UBM) structures, and/or another type of contacts. The metallization layers 224 and the contacts 226 may each include one or more conductive materials, such as copper (Cu), gold (Au), silver (Ag), nickel (Ni), tin (Sn), ruthenium (Ru), cobalt (Co), tungsten (W), titanium (Ti), one or more metals, one or more conductive ceramics, and/or another type of conductive materials.

The interconnect region 216 may include one or more dielectric layers 228, which may include a silicon nitride ($SiN_x$), an oxide (e.g., a silicon oxide ($SiO_x$) and/or another oxide material), a low dielectric constant (low-k) dielectric material, and/or another type of dielectric material. In some implementations, one or more etch stop layers (ESLs) may be included in between layers of the one or more dielectric layers 228. The one or more ESLs may include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$), among other examples.

The interconnect region 216 may further include metallization layers 230 in the one or more dielectric layers 228. The decoupling trench capacitor structures 220*a*-220*c* in the device region 214 may be electrically connected and/or physically connected with one or more of the metallization layers 230. The metallization layers 230 may include conductive lines, trenches, vias, pillars, interconnects, and/or another type of metallization layers. Contacts 232 may be included in the one or more dielectric layers 228 of the interconnect region 216. The contacts 232 may be electrically connected and/or physically connected with one or more of the metallization layers 230. Moreover, the contacts 232 may be electrically and/or physically connected with the contacts 226 of the second semiconductor die 206. The contacts 232 may include conductive terminals, conductive pads, conductive pillars, UBM structures, and/or another type of contacts. The metallization layers 230 and the contacts 232 may each include one or more conductive materials, such as copper (Cu), gold (Au), silver (Ag), nickel (Ni), tin (Sn), ruthenium (Ru), cobalt (Co), tungsten (W), titanium (Ti), one or more metals, one or more conductive ceramics, and/or another type of conductive materials.

As further shown in FIG. 2B, the semiconductor die package 200 may include a redistribution structure 234. The redistribution structure 234 may include a redistribution layer (RDL) structure, an interposer, a silicon-based interposer, a polymer-based interposer, and/or another type of redistribution structure. The redistribution structure 234 may be configured to fan out and/or route signals and I/O of the semiconductor dies 202 and 206.

The redistribution structure 234 may include one or more dielectric layers 236 and a plurality of metallization layers 238 disposed in the one or more dielectric layers 236. The dielectric layer(s) 236 may include polybenzoxazole (PBO), a polyimide, a low temperature polyimide (LTPI), an epoxy resin, an acrylic reason, a phenol resin, benzocyclobutene (BCB), one or more dielectric layers, and/or another suitable dielectric material.

The metallization layers 238 of the redistribution structure 234 may include one or more materials such as a gold (Au) material, a copper (Cu) material, a silver (Ag) material, a nickel (Ni) material, a tin (Sn) material, and/or a palladium (Pd) material, among other examples. The metallization layers 238 of the redistribution structure 234 may include metal lines, vias, interconnects, and/or another type of metallization layers.

As further shown in FIG. 2B, the semiconductor die package 200 may include one or more backside through silicon via (BTSV) structures 240 through the device region 210, and into a portion of the interconnect region 216 of the first semiconductor die 202. The one or more BTSV structures 240 may include vertically elongated conductive structures (e.g., conductive pillars, conductive vias) that electrically connect one or more of the metallization layers 230 in the interconnect region 216 of the first semiconductor die 202 to one or more metallization layers 238 in the redistribution structure 234. The BTSV structures 240 may be referred to as through silicon via (TSV) structures in that the BTSV structures 240 extend fully through a semiconductor substrate (e.g., a silicon substrate) of the device region 214 as opposed to extending fully through a dielectric layer or an insulator layer. The one or more BTSV structures 240 may include one or more conductive materials, such as copper (Cu), gold (Au), silver (Ag), nickel (Ni), tin (Sn), ruthenium (Ru), cobalt (Co), tungsten (W), titanium (Ti), one or more metals, one or more conductive ceramics, and/or another type of conductive materials.

UBM layers 242 may be included on a top surface of the one or more dielectric layers 236. The UBM layers 242 may be electrically connected and/or physically connected with one or more metallization layers 238 in the redistribution structure 234. The UBM layers 242 may be included in recesses in the top surface of the one or more dielectric layers 236. The UBM layers 242 may include one or more conductive materials, such as copper (Cu), gold (Au), silver (Ag), nickel (Ni), tin (Sn), ruthenium (Ru), cobalt (Co), tungsten (W), titanium (Ti), one or more metals, one or more conductive ceramics, and/or another type of conductive materials.

As further shown in FIG. 2B, the semiconductor die package 200 may include conductive terminals 244. The conductive terminals 244 may be electrically connected and/or physically connected with the UBM layers 242. The UBM layers 242 may be included to facilitate adhesion to the one or more metallization layers 238 in the redistribution structure 234, and/or to provide increased structural rigidity for the conductive terminals 244 (e.g., by increasing the surface area to which the conductive terminals 244 are connected). The conductive terminals 244 may include ball grid array (BGA) balls, land grid array (LGA) pads, pin grid array (PGA) pins, and/or another type of conductive terminals. The conductive terminals 244 may enable the semiconductor die package 200 to be mounted to a circuit board, a socket (e.g., an LGA socket), an interposer or redistribution structure of a semiconductor device package (e.g., a chip on wafer on substrate CoWoS package, an integrated fanout (InFO) package), and/or another type of mounting structure.

As shown in FIG. 2C, the decoupling trench capacitor structures 220*a* may have a depth (D1) relative to a surface 246 (e.g., the bottom surface) of the semiconductor substrate of the device region 214. The depth (D1) may correspond to the height of the decoupling trench capacitor structures 220*a*. The decoupling trench capacitor structures 220*b* may have a depth (D2) relative to the surface 246 of the semiconductor substrate of the device region 214. The depth (D2) may correspond to the height of the decoupling trench capacitor structures 220*b*. The decoupling trench capacitor structures 220*c* may have a depth (D3) relative to the surface 246 of the semiconductor substrate of the device region 214. The depth (D3) may correspond to the height of the decoupling trench capacitor structures 220*c*.

The depth (D2) of the decoupling trench capacitor structures 220*b* in the decoupling trench capacitor region 204*c* may be greater relative to the depth (D1) of the decoupling trench capacitor structures 220*a* in the decoupling trench capacitor region 204*a*. The depth (D3) of the decoupling trench capacitor structures 220*c* in the decoupling trench capacitor region 204*e* may be greater relative to the depth (D2) of the decoupling trench capacitor structures 220*b* in the decoupling trench capacitor region 204*c*, and may be greater relative to the depth (D1) of the decoupling trench capacitor structures 220*a* in the decoupling trench capacitor region 204*a*.

In some implementations, the depth (D2) (corresponding to the height of the decoupling trench capacitor structures 220*b*) may be selected as the target depth for the semiconductor die package 200. In these implementations, the depth (D1) (corresponding to the height of the decoupling trench capacitor structures 220*a*) and the depth (D3) (corresponding to the height of the decoupling trench capacitor structures 220*c*) may be selected to be within a range of approximately 15% less than the depth (D2) to approximately 15% greater than the depth (D2). However, other values for the range are within the scope of the present disclosure.

As further shown in FIG. 2C, the decoupling trench capacitor structures 220*a* may have a width (W1), the decoupling trench capacitor structures 220*b* may have a width (W2), and the decoupling trench capacitor structures 220*c* may have a width (W3). In some implementations, the widths (W1-W3) are approximately equal. In some implementations, two or more of the widths (W1-W3) are different widths. In some implementations, the depth (D2) and the width (W2) are both greater relative to the depth (D1) and the width (W1), respectively.

As indicated above, FIGS. 2A-2C are provided as an example. Other examples may differ from what is described with regard to FIGS. 2A-2C.

Figure 3A:
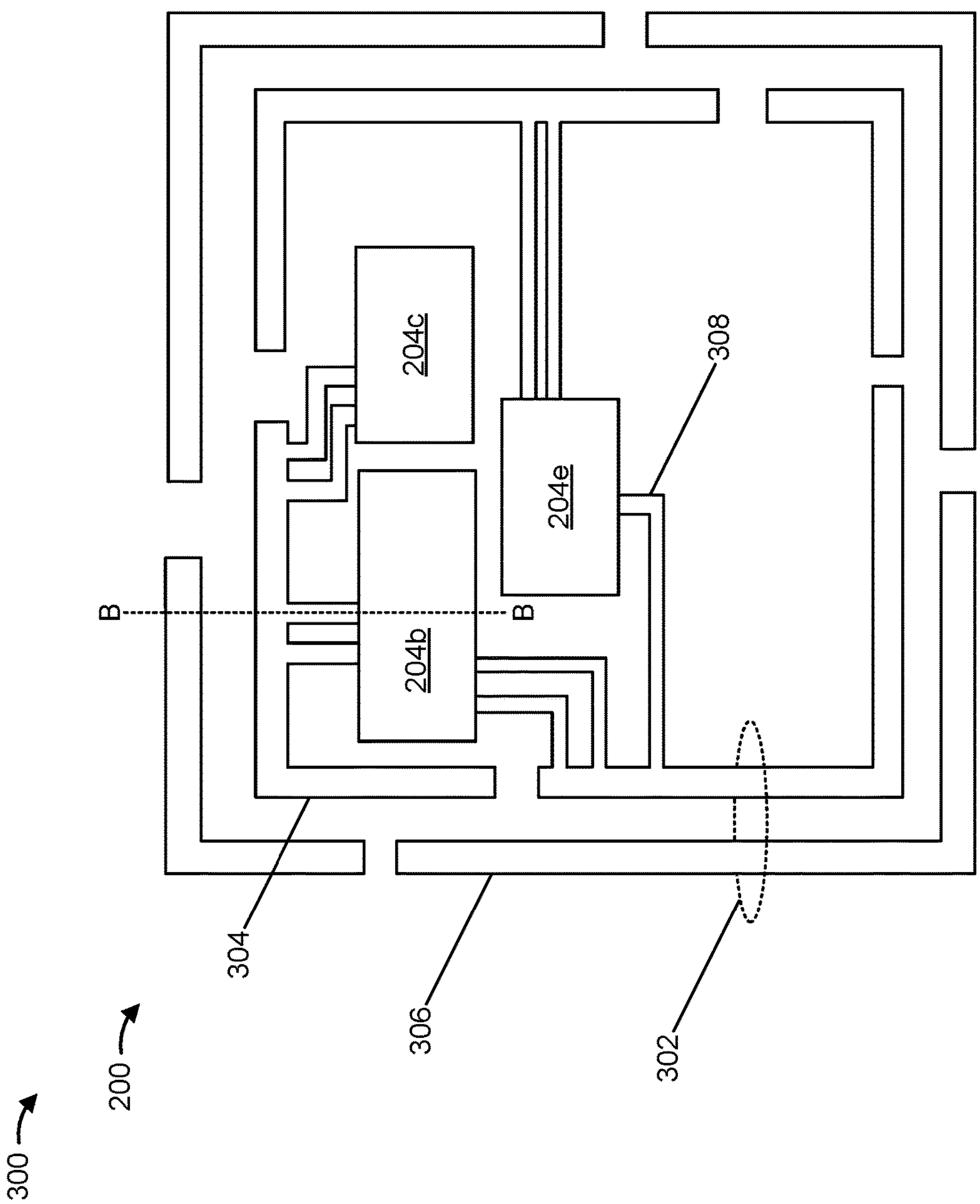
FIGS. 3A and 3B are diagrams of an example implementation of the semiconductor die package described herein.
Figure 3B:
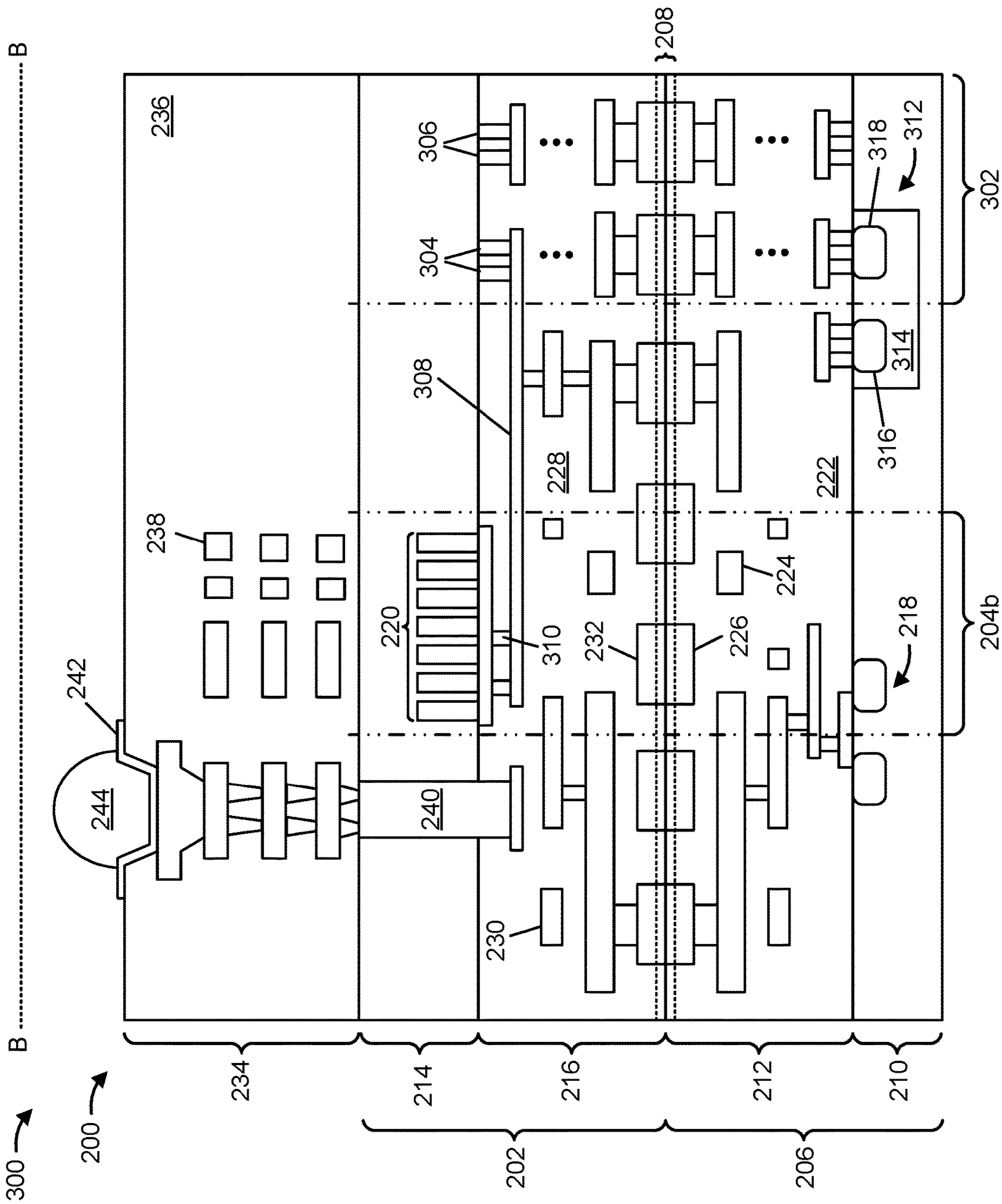

FIGS. 3A and 3B are diagrams of an example implementation 300 of the semiconductor die package 200 described herein. The example implementation 300 includes a portion of the semiconductor die package 200 that includes a seal ring structure 302. FIG. 3A illustrates a top-down view of another portion of the semiconductor die package 200. FIG. 3B illustrates a cross-section view of the other portion of the semiconductor die package 200 along line B-B in FIG. 3A.

As shown in FIG. 3A, the portion of the semiconductor die package 200 in the example implementation 300 includes a seal ring structure 302. The seal ring structure 302 may be included around the perimeter (e.g., the outer perimeter) of the semiconductor die package 200. The seal ring structure 302 may be configured to provide increased structural rigidity for the semiconductor die package 200, which may reduce the likelihood of cracking, warpage, and/or another type of physical damage that might otherwise result from physical stresses that are exerted on the semiconductor die package 200. Additionally and/or alternatively, the seal ring structure 302 may be configured to provide a humidity seal for the semiconductor die package 200. Thus, the seal ring structure 302 may reduce the likelihood of humidity ingress in the semiconductor die package 200, which might otherwise result in oxidation and/or physical deterioration of the semiconductor die package 200.

As further shown in FIG. 3A, the seal ring structure 302 may include an inner seal ring structure 304 and an outer seal ring structure 306. Each of the inner seal ring structure 304 and an outer seal ring structure 306 may include a plurality of segmented metallization layers. One or more of the decoupling trench capacitor regions 204*a*-204*n* may be electrically connected with the inner seal ring structure 304 by metallization layers 308. This enables electrical signals to be routed between the decoupling trench capacitor structures of the decoupling trench capacitor regions 204*a*-204*n* and other semiconductor devices in the semiconductor die package 200 through the inner seal ring structure 304.

As shown in FIG. 3B, the portion of the semiconductor die package 200 illustrated in the example implementation 300 may include components 202-244 similar to those illustrated and described above in connection with FIGS. 2A-2C. As further shown in FIG. 3B, the portion of the semiconductor die package 200 illustrated in the example implementation 300 may include the seal ring structure 302. The seal ring structure 302 may extend between the device region 210 of the second semiconductor die 206 and the device region 214 of the first semiconductor die 202. Moreover, the seal ring structure 302 may extend through the interconnect region 212 of the second semiconductor die 206 and through the interconnect region 216 of the first semiconductor die 202. The seal ring structure 302 may include metallization layers 224 and contacts 226 included in the interconnect region 212, and may include metallization layers 230 and contacts 232 included in the interconnect region 216.

As further shown in FIG. 3B, decoupling trench capacitor structures 220 in the decoupling trench capacitor region 204*b* may be electrically connected and/or physically connected with the inner seal ring structure 304 by the metallization layer 308. The metallization layer 308 may be included in the interconnect region 216 of the first semiconductor die 202. Conductive lines 310 under the decoupling trench capacitor structures 220 may electrically connect the metallization layer 308 with a metallization layer 230, which may electrically connect the decoupling trench capacitor structures 220 with the conductive lines 310.

As further shown in FIG. 3B, the inner seal ring structure 304 may be electrically connected and/or physically connected with an electrostatic discharge (ESD) protection circuit 312 that is included in the semiconductor substrate of the device region 210 of the second semiconductor die 206. The inner seal ring structure 304 of the seal ring structure 302 electrically connects the ESD protection circuit 312 with the decoupling trench capacitor structures 220 in the decoupling trench capacitor region 204*b*.

The ESD protection circuit 312 may include one or more semiconductor diodes and/or another type of semiconductor devices that are configured to provide the one or more semiconductor devices 218 with ESD protection (e.g., protection against electrical shots, protection against electrostatic buildup). One or more regions of the semiconductor substrate of the device region 210 may be doped to form an n-well 314. N-type contacts 316 and p-type contacts 318 of the one or more diodes of the ESD protection circuit 312 may be included in the n-well 314.

As indicated above, FIGS. 3A and 3B are provided as an example. Other examples may differ from what is described with regard to FIGS. 3A and 3B.

Figure 4:
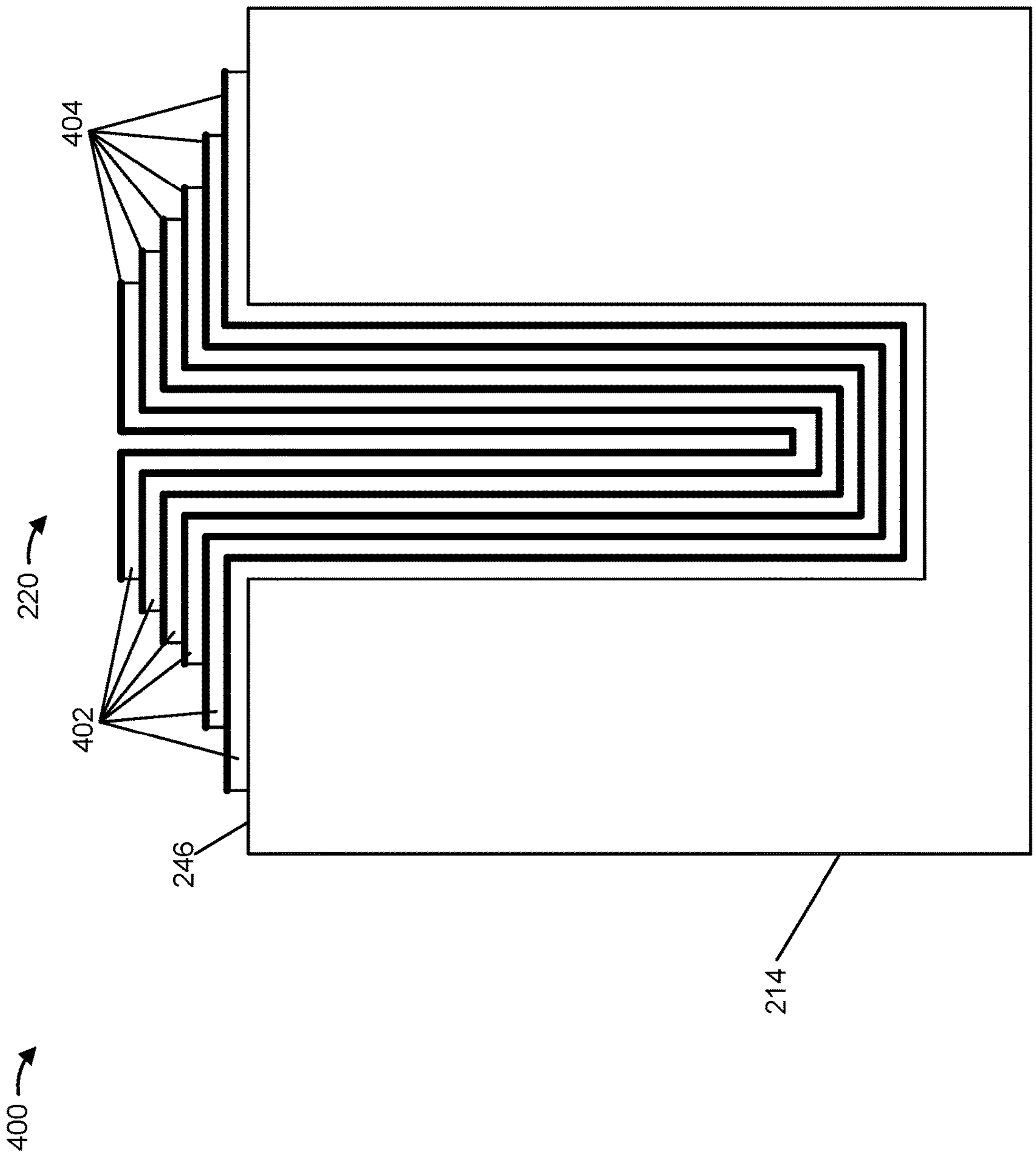
FIG. 4 is a diagram of an example implementation of a decoupling trench capacitor structure described herein.

FIG. 4 is a diagram of an example implementation 400 of a decoupling trench capacitor structure 220 described herein. As shown in FIG. 4, the decoupling trench capacitor structure 220 may be formed in the device region 214. In particular, the decoupling trench capacitor structure 220 may extend into the semiconductor substrate of the device region 214 from the surface 246.

The decoupling trench capacitor structure 220 may include a plurality of conductive layers 402 and a plurality of dielectric layers 404. The conductive layers 402 and the dielectric layers 404 may be arranged in an alternating configuration in the decoupling trench capacitor structure 220. For example, a first conductive layer 402 may be included in the decoupling trench capacitor structure 220, a first dielectric layer 404 may be included over the first conductive layer 402, a second conductive layer 402 may be included over the first dielectric layer 404, and so on. A dielectric layer 404 between a pair of conductive layers 402 may correspond to a trench capacitor of the decoupling trench capacitor structure 220, where the conductive layers 402 correspond to the electrodes of the trench capacitor and the dielectric layer 404 corresponds to the dielectric medium of the trench capacitor. In this way, the decoupling trench capacitor structure 220 includes a plurality of layered trench capacitors that extend into the semiconductor substrate of the device region 214.

In general, a deeper decoupling trench capacitor structure 220 may provide a greater amount of decoupling capacitance relative to a shallower deeper decoupling trench capacitor structure 220. Additionally and/or alternatively, a wider deeper decoupling trench capacitor structure 220 may include a greater quantity of conductive layers 402 and a greater quantity of dielectric layers 404 and, therefore, a greater quantity of decoupling trench capacitors relative to a narrower deeper decoupling trench capacitor structure 220. This enables a wider deeper decoupling trench capacitor structure 220 to also provide a greater amount of decoupling capacitance relative to a narrower deeper decoupling trench capacitor structure 220.

The conductive layers 402 may include one or more conductive materials such as a conductive metal (e.g., copper (Cu), tungsten (W), titanium (Ti), tantalum (Ta), ruthenium (Ru), cobalt (Co)), a conductive ceramic (e.g., tantalum nitride (TaN), titanium nitride (TiN)), and/or another type of conductive material. The dielectric layers 404 may include one or more dielectric materials such as an oxide (e.g., silicon oxide ($SiO_x$)), a nitride (e.g., silicon nitride ($Si_xN_y$), and/or another suitable dielectric material.

As further shown in FIG. 4, the conductive layers 402 and the dielectric layers 404 may partial extend out of the semiconductor substrate of the device region 214 and may extend along a portion of the surface 246 of the semiconductor substrate of the device region 214. This enables conductive terminals to be electrically connected and/or physically connected with the conductive layers 402. The conductive terminals may electrically connect and/or physically connect the decoupling trench capacitor structure 220 to other structures and/or devices in the semiconductor die package 200.

As indicated above, FIG. 4 is provided as an example. Other examples may differ from what is described with regard to FIG. 4.

FIGS. 5A-5E are diagrams of an example implementation 500 of forming a semiconductor die described herein. In some implementations, the example implementation 500 includes an example process for forming a portion of the second semiconductor die 206. In some implementations, one or more of the semiconductor processing tools 102-114 and/or the wafer/die transport tool 116 may perform one or more of the operations described in connection with the example implementation 500. In some implementations, one or more operations described in connection with the example implementation 500 may be performed by another semiconductor processing tool.

Figure 5A:
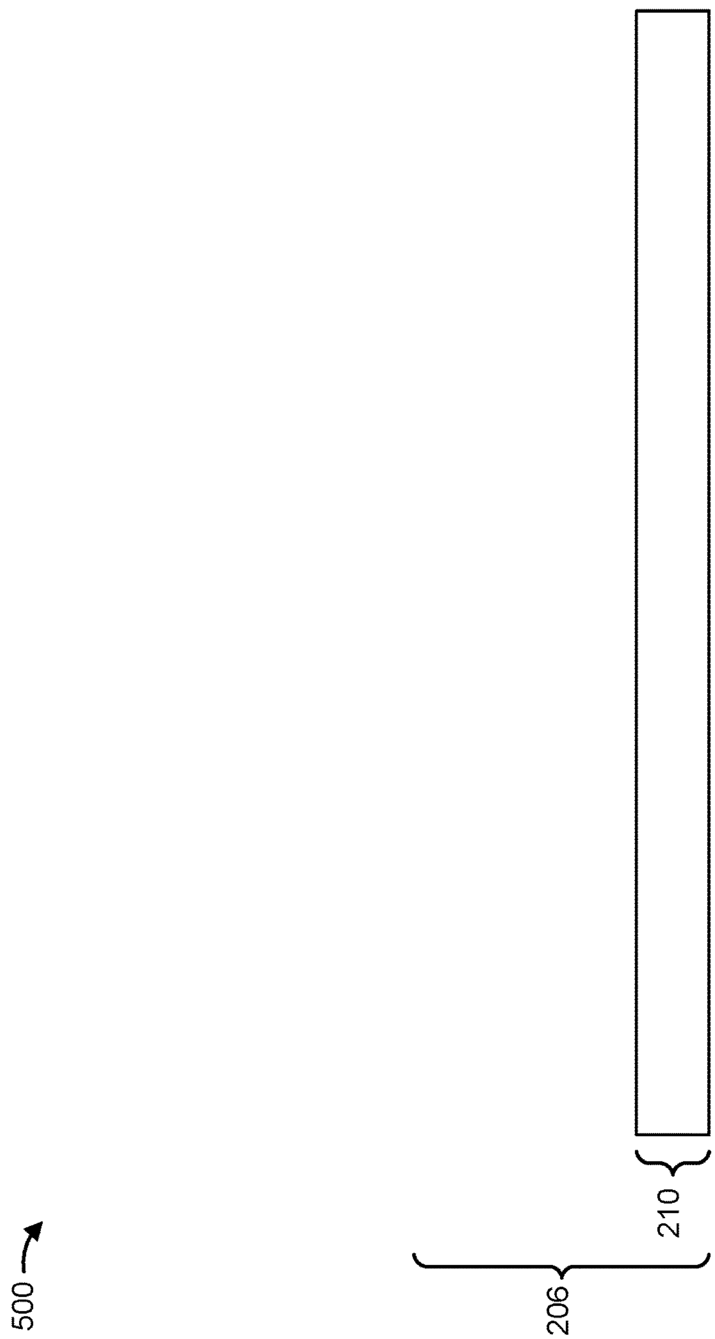
FIGS. 5A-5E are diagrams of an example implementation of forming a semiconductor die described herein.

Turning to FIG. 5A, one or more of the operations in the example implementation 500 may be performed in connection with the semiconductor substrate of the device region 210 of the second semiconductor die 206. The semiconductor substrate of the device region 210 may be provided in the form of a semiconductor wafer or another type of substrate.

Figure 5B:
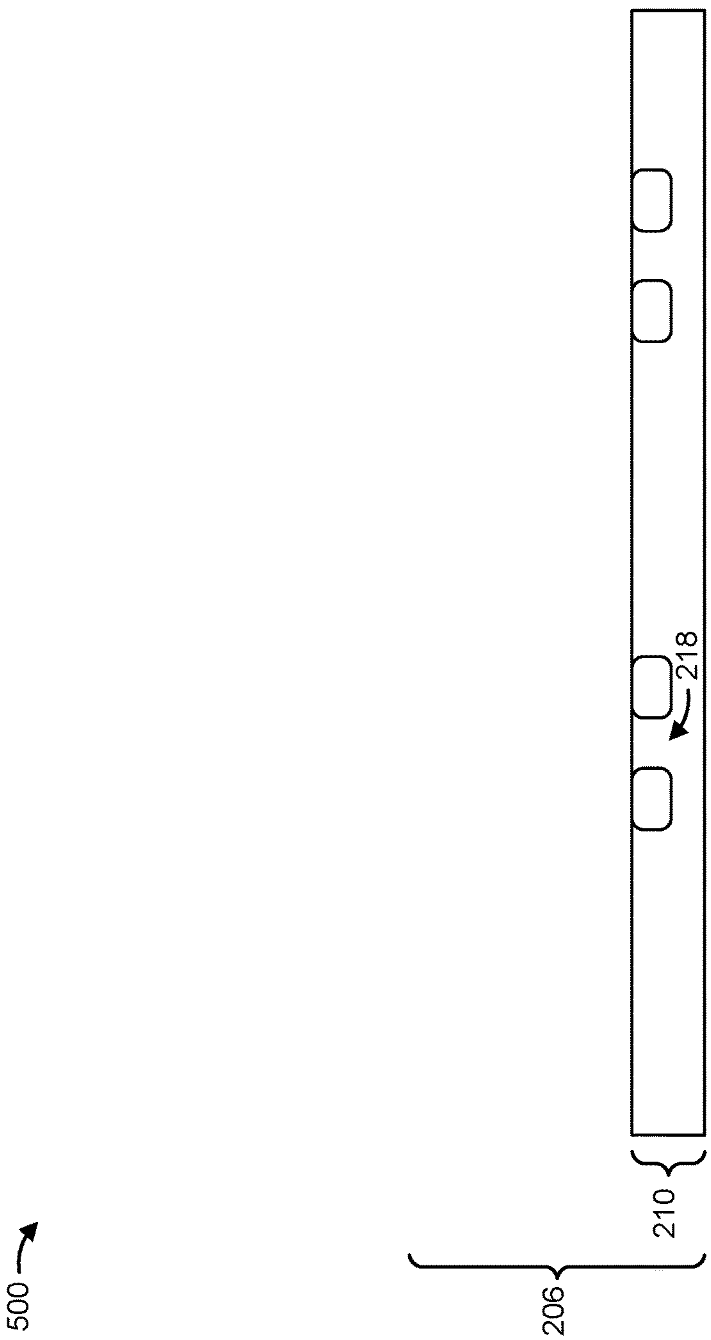

As shown in FIG. 5B, one or more semiconductor devices 218 may be formed in the device region 210. For example, one or more of the semiconductor processing tools 102-114 may perform photolithography patterning operations, etching operations, deposition operations, CMP operations, and/or another type of operations to form one or more transistors, one or more capacitors, one or more memory cells, one or more circuits (e.g., one or more ICs), and/or one or more semiconductor devices of another type. In some implementations, one or more regions of the semiconductor substrate of the device region 210 may be doped in an ion implantation operation to form one or more p-wells, one or more n-wells, and/or one or more deep n-wells. In some implementations, the deposition tool 102 may deposit one or more source/drain regions, one or more gate structures, and/or one or more STI regions, among other examples.

Figure 5C:
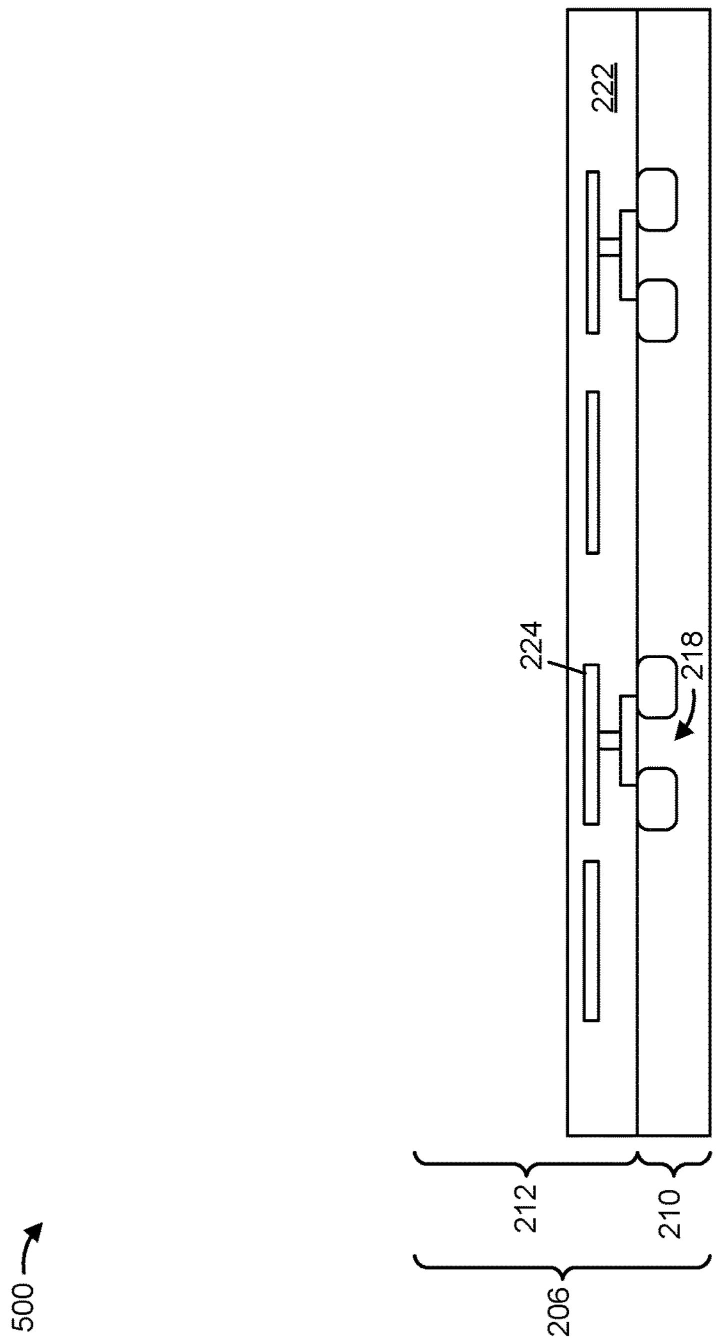
Figure 5D:
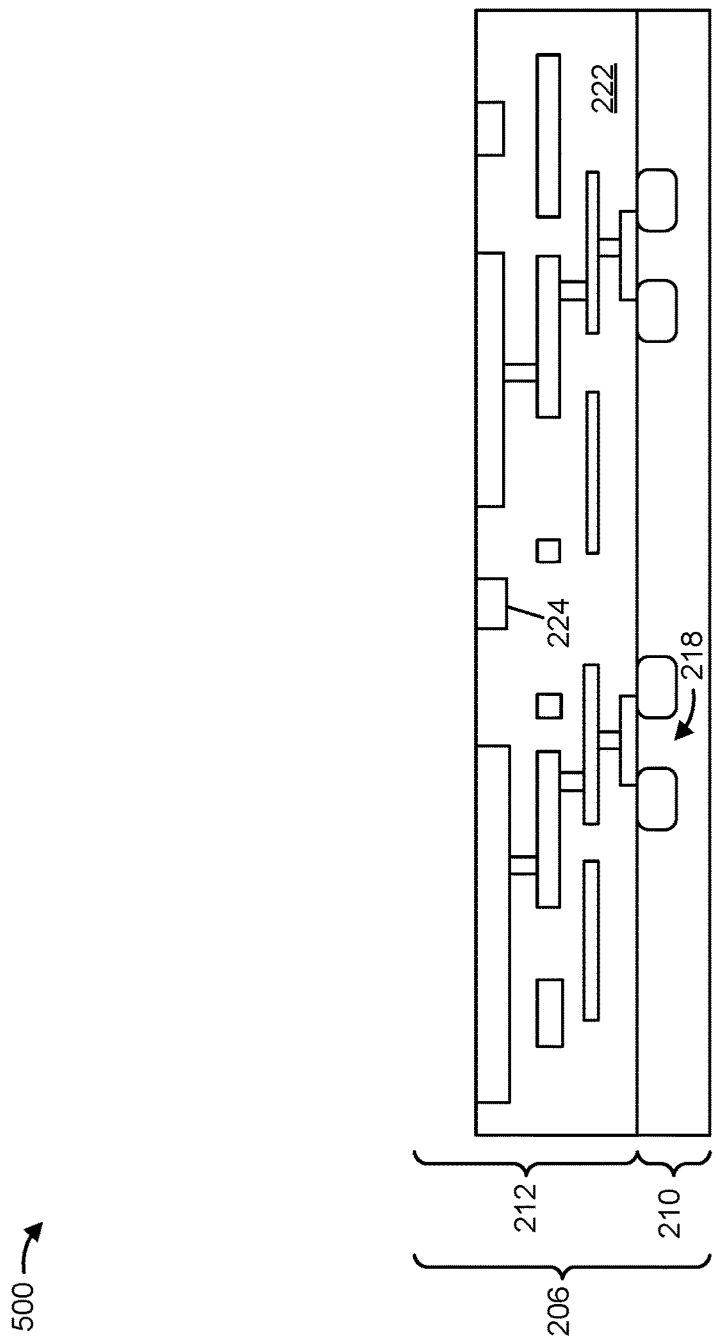
Figure 5E:
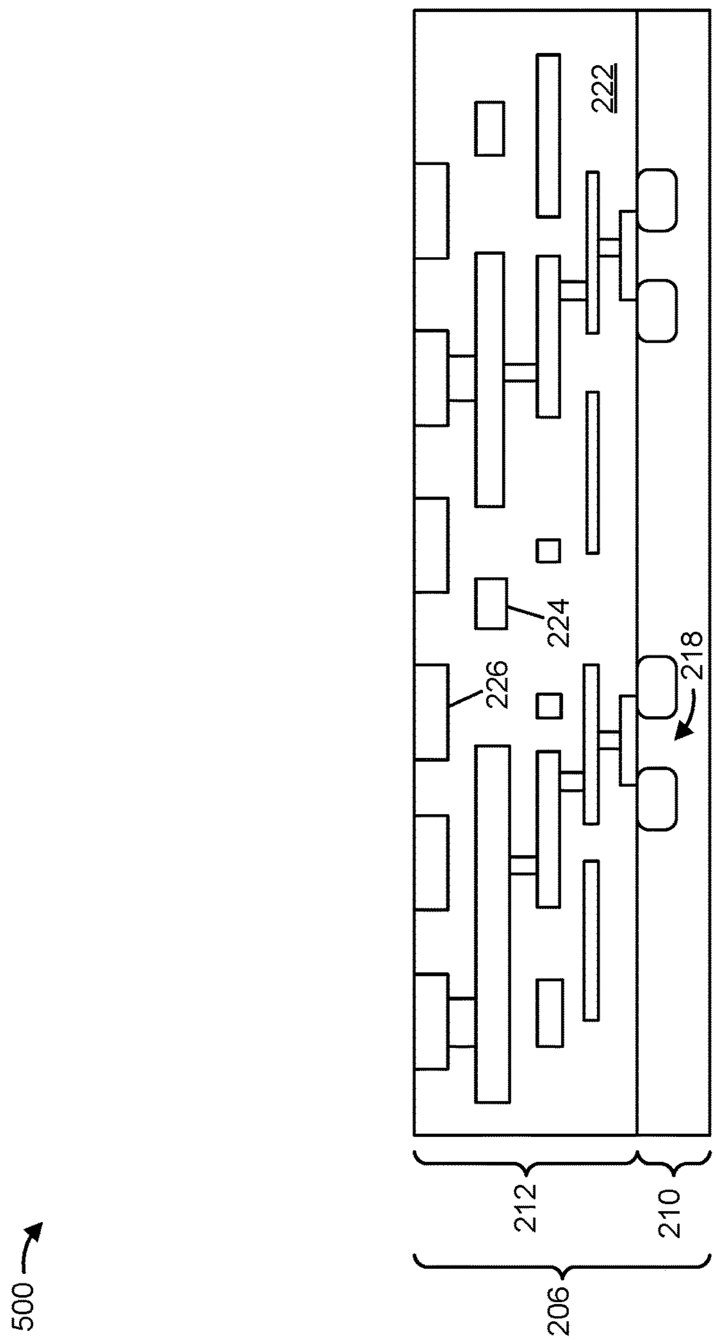

As shown in FIGS. 5C-5E, the interconnect region 212 of the second semiconductor die 206 may be formed over and/or on the semiconductor substrate of the device region 210. One or more of the semiconductor processing tools 102-114 may form the interconnect region 212 by forming one or more dielectric layers 222 and forming a plurality of metallization layers 224 in the plurality of dielectric layers 222. For example, the deposition tool 102 may deposit a first layer of the one or more dielectric layers 222 (e.g., using a CVD technique, an ALD technique, a PVD technique, and/or another type of deposition technique), the etch tool 108 may remove portions of the first layer to form recesses in the first layer, and the deposition tool 102 and/or the plating tool 112 may form a first metallization layer of the plurality of metallization layers 224 in the recesses (e.g., using a CVD technique, an ALD technique, a PVD technique, an electroplating technique, and/or another type of deposition technique). At least a portion of the first metallization layer may be electrically connected and/or physically connected with the semiconductor device(s) 218. The deposition tool 102, the etch tool 108, the plating tool 112, and/or another semiconductor processing tool may continue to perform similar processing operations to forming the interconnect region 212 until a sufficient or desired arrangement of metallization layers 224 is achieved.

As shown in FIG. 5E, one or more of the semiconductor processing tools 102-114 may form another layer of the one or more dielectric layers 222, and may form a plurality of contacts 226 in the layer such that the contacts 226 are electrically connected and/or physically connected with one or more of the metallization layers 224. For example, the deposition tool 102 may deposit the layer of the one or more dielectric layers 222 (e.g., using a CVD technique, an ALD technique, a PVD technique, and/or another type of deposition technique), the etch tool 108 may remove portions of the layer to form recesses in the layer, and the deposition tool 102 and/or the plating tool 112 may form the contacts 226 in the recesses (e.g., using a CVD technique, an ALD technique, a PVD technique, an electroplating technique, and/or another type of deposition technique).

As indicated above, FIGS. 5A-5E are provided as an example. Other examples may differ from what is described with regard to FIGS. 5A-5E.

FIGS. 6A-6E are diagrams of an example implementation 600 of forming a semiconductor die described herein. In some implementations, the example implementation 600 includes an example process for forming another portion the second semiconductor die 206. In some implementations, one or more of the semiconductor processing tools 102-114 and/or the wafer/die transport tool 116 may perform one or more of the operations described in connection with the example implementation 600. In some implementations, one or more operations described in connection with the example implementation 600 may be performed by another semiconductor processing tool.

Figure 6A:
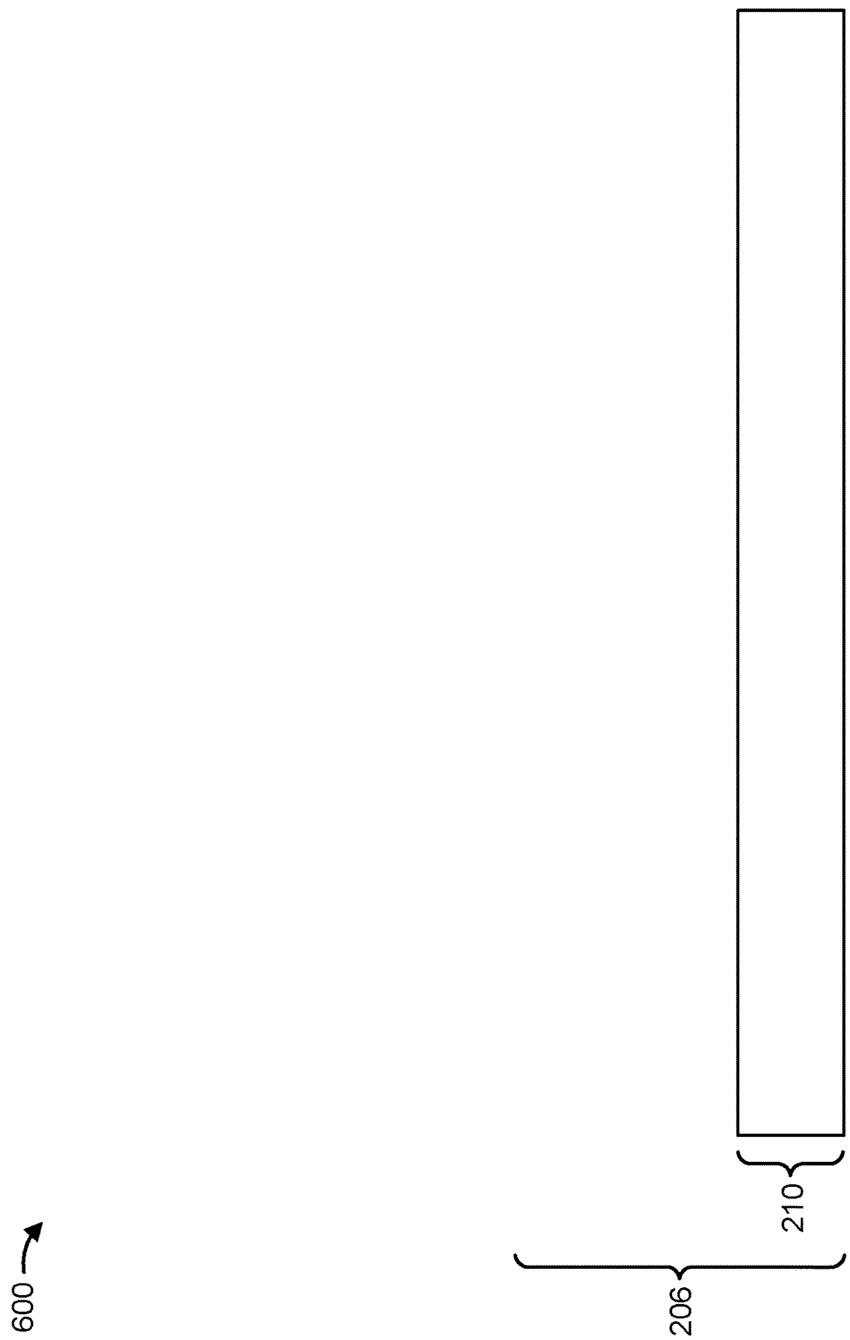
FIGS. 6A-6E are diagrams of an example implementation of forming a semiconductor die described herein.

Turning to FIG. 6A, one or more of the operations in the example implementation 600 may be performed in connection with the semiconductor substrate of the device region 210 of the second semiconductor die 206. The semiconductor substrate of the device region 210 may be provided in the form of a semiconductor wafer or another type of substrate.

Figure 6B:
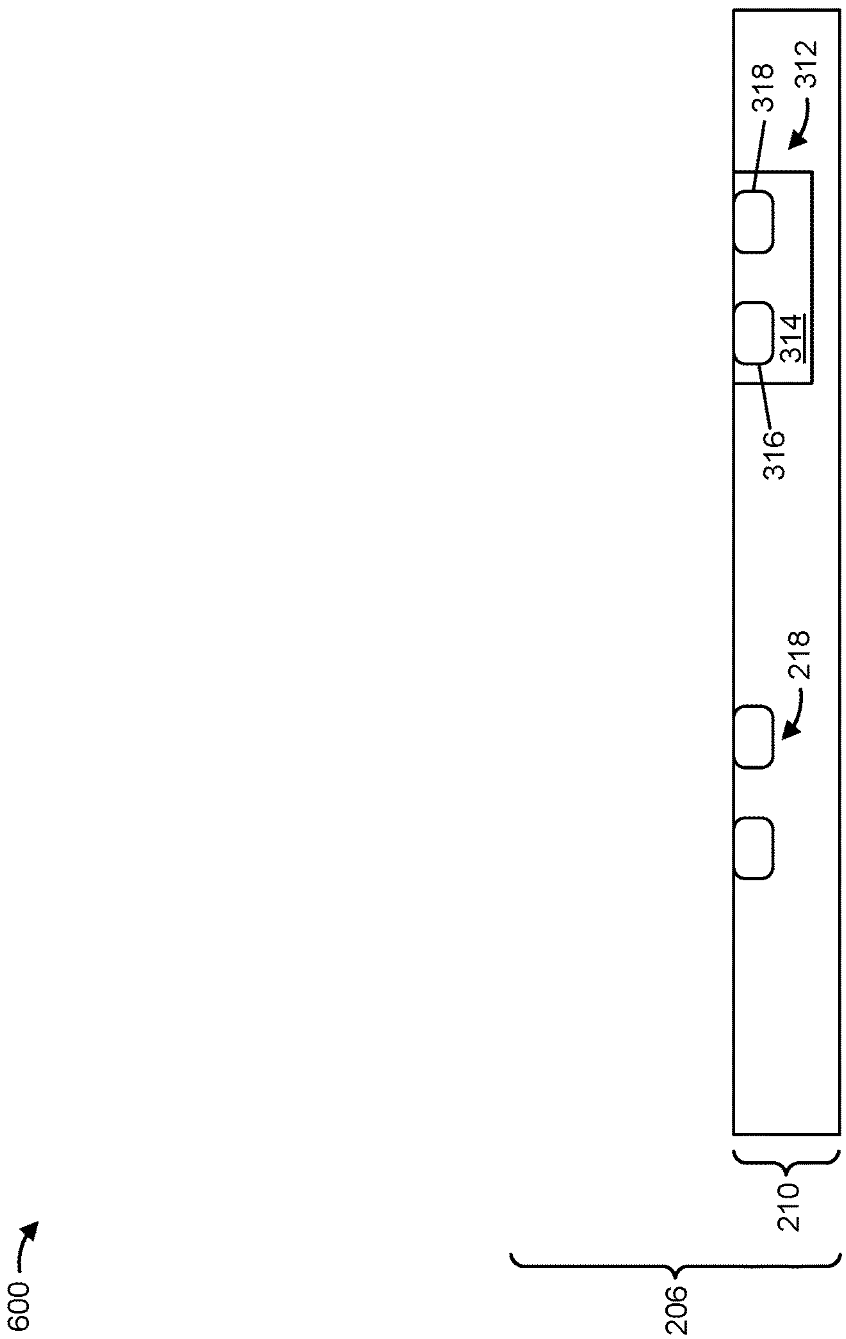

As shown in FIG. 6B, one or more semiconductor devices 218 may be formed in the device region 210. For example, one or more of the semiconductor processing tools 102-114 may perform photolithography patterning operations, etching operations, deposition operations, CMP operations, and/or another type of operations to form one or more transistors, one or more capacitors, one or more memory cells, one or more circuits (e.g., one or more ICs), and/or one or more semiconductor devices of another type. In some implementations, one or more regions of the semiconductor substrate of the device region 210 may be doped in an ion implantation operation to form one or more p-wells, one or more n-wells, and/or one or more deep n-wells. In some implementations, the deposition tool 102 may deposit one or more source/drain regions, one or more gate structures, and/or one or more STI regions, among other examples.

As further shown in FIG. 6B, an ESD protection circuit 312 may be formed in the semiconductor substrate of the device region 210. In some implementations, one or more regions of the semiconductor substrate of the device region 210 may be doped in an ion implantation operation to form an n-well 314. In some implementations, one or more of the semiconductor processing tools 102-114 may perform photolithography patterning operations, etching operations, deposition operations, CMP operations, and/or another type of operations to form an n-type contact 316 of a diode of the ESD protection circuit 312 and a p-type contact 318 of the diode of the ESD protection circuit 312.

Figure 6C:
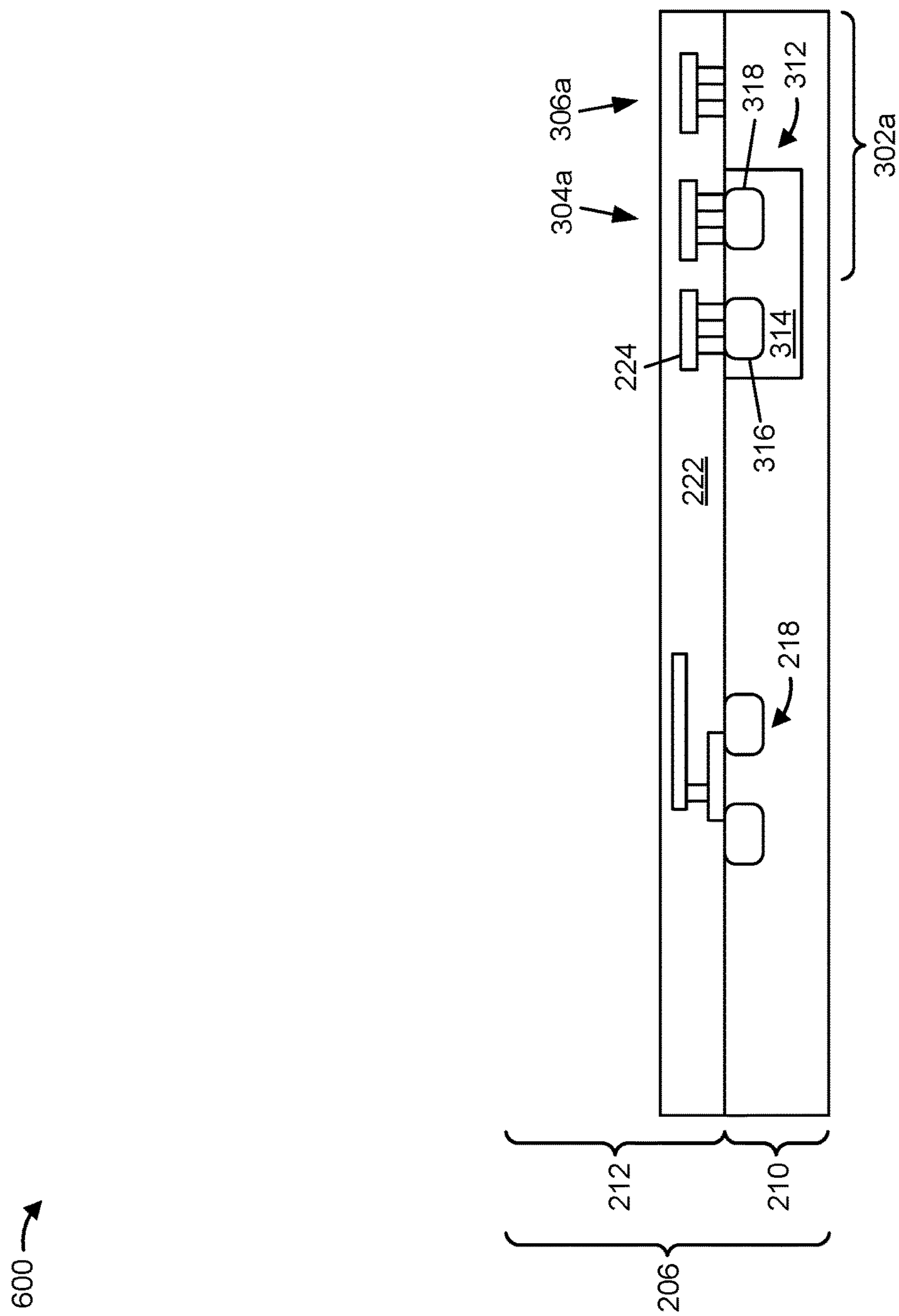
Figure 6D:
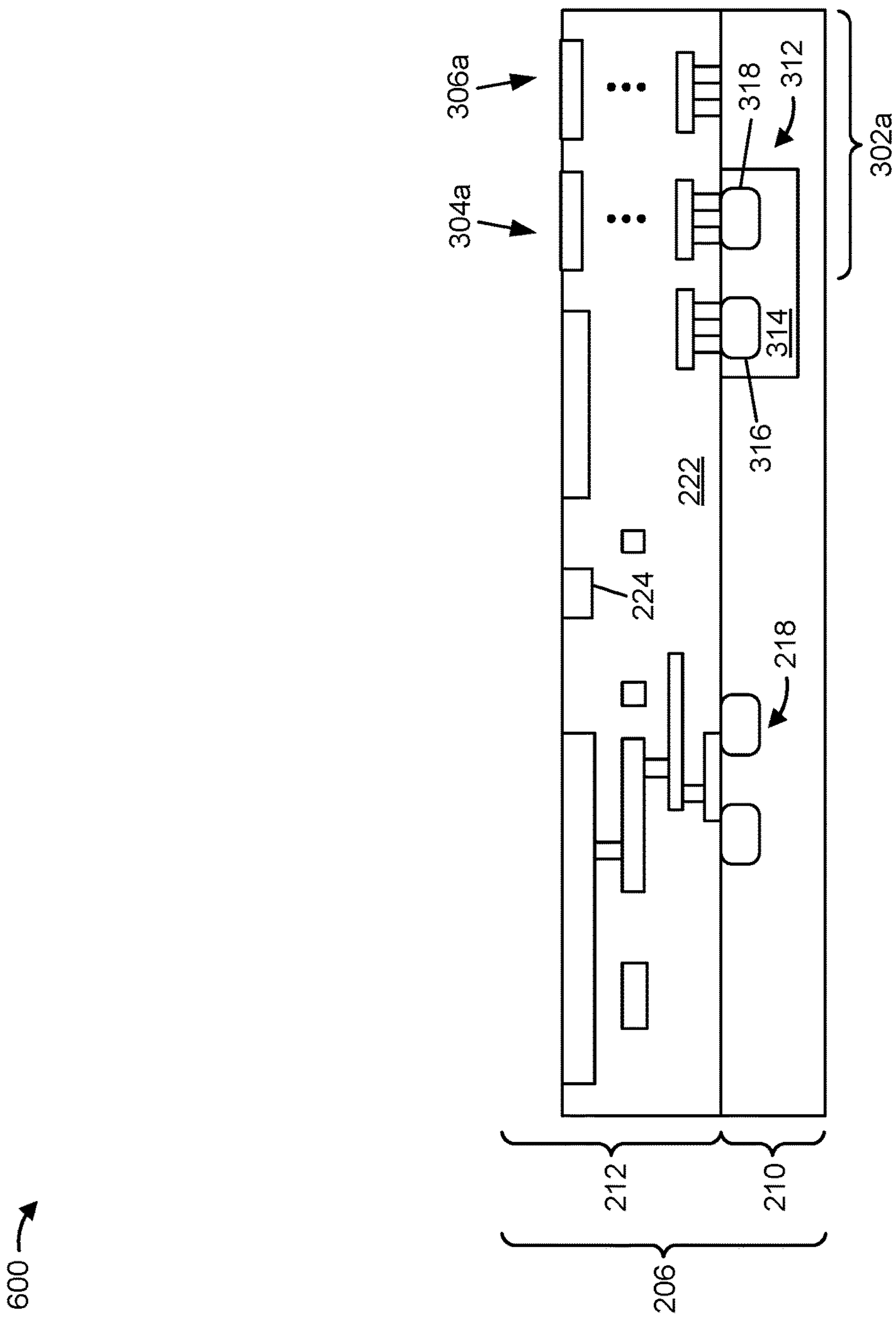
Figure 6E:
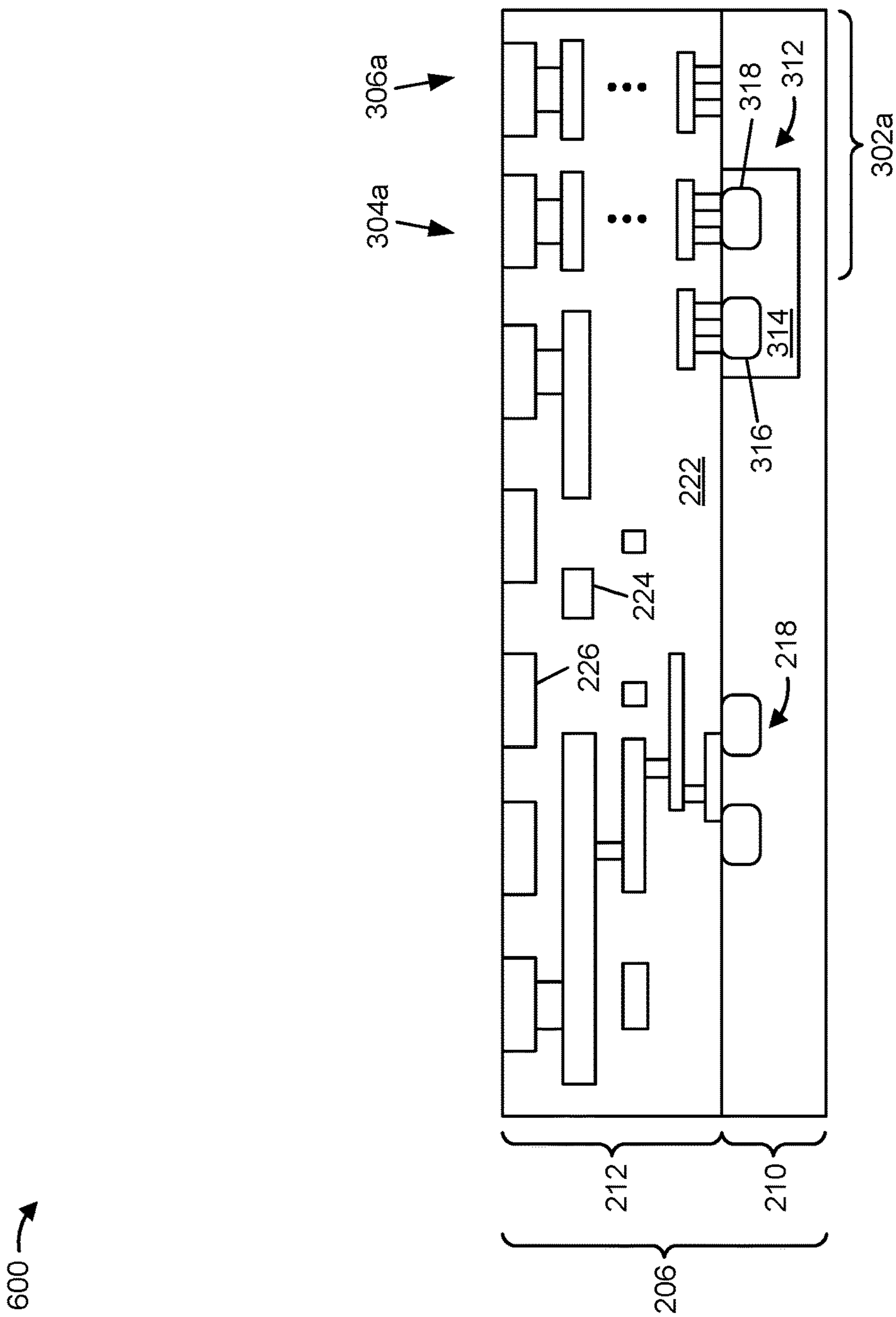

As shown in FIGS. 6C-6E, the interconnect region 212 of the second semiconductor die 206 may be formed over and/or on the semiconductor substrate of the device region 210. One or more of the semiconductor processing tools 102-114 may form the interconnect region 212 by forming one or more dielectric layers 222 and forming a plurality of metallization layers 224 in the plurality of dielectric layers 222. For example, the deposition tool 102 may deposit a first layer of the one or more dielectric layers 222 (e.g., using a CVD technique, an ALD technique, a PVD technique, and/or another type of deposition technique), the etch tool 108 may remove portions of the first layer to form recesses in the first layer, and the deposition tool 102 and/or the plating tool 112 may form a first metallization layer of the plurality of metallization layers 224 in the recesses (e.g., using a CVD technique, an ALD technique, a PVD technique, an electroplating technique, and/or another type of deposition technique). At least a portion of the first metallization layer may be electrically connected and/or physically connected with the semiconductor device(s) 218. Another portion of the first metallization layer may be electrically connected and/or physically connected with one or more n-type contacts 316 of the ESD protection circuit 312. The deposition tool 102, the etch tool 108, the plating tool 112, and/or another semiconductor processing tool may continue to perform similar processing operations to forming the interconnect region 212 until a sufficient or desired arrangement of metallization layers 224 is achieved.

As further shown in FIG. 6C-6E, a plurality of structures may be formed in a portion 302*a* of a seal ring structure 302 in the interconnect region 212. For example, a portion 304*a* of an inner seal ring structure 304 of the seal ring structure 302 may be formed in the interconnect region 212. As another example, a portion 306*a* of an outer seal ring structure 306 of the seal ring structure 302 may be formed in the interconnect region 212. Forming the portions 304*a* and 306*a* may include forming a plurality of metallization layers 224 in the one or more dielectric layers 222 of the interconnect region 212. For example, the deposition tool 102 may deposit a first layer of the one or more dielectric layers 222 (e.g., using a CVD technique, an ALD technique, a PVD technique, and/or another type of deposition technique), the etch tool 108 may remove portions of the first layer to form recesses in the first layer, and the deposition tool 102 and/or the plating tool 112 may form a first metallization layer of the plurality of metallization layers 224 in the recesses (e.g., using a CVD technique, an ALD technique, a PVD technique, an electroplating technique, and/or another type of deposition technique) for the portions 304*a* and 306*a* in the portion 302*a* of the seal ring structure 302. At least a portion of the first metallization layer may be electrically connected and/or physically connected with one or more p-type contacts 318 of the ESD protection circuit 312. The deposition tool 102, the etch tool 108, the plating tool 112, and/or another semiconductor processing tool may continue to perform similar processing operations to forming the interconnect region 212 until a sufficient or desired arrangement of metallization layers 224 in the portions 304*a* and 306*a* in the portion 302*a* of the seal ring structure 302 is achieved.

As shown in FIG. 6E, one or more of the semiconductor processing tools 102-114 may form another layer of the one or more dielectric layers 222, and may form a plurality of contacts 226 in the layer such that the contacts 226 are electrically connected and/or physically connected with one or more of the metallization layers 224. For example, the deposition tool 102 may deposit the layer of the one or more dielectric layers 222 (e.g., using a CVD technique, an ALD technique, a PVD technique, and/or another type of deposition technique), the etch tool 108 may remove portions of the layer to form recesses in the layer, and the deposition tool 102 and/or the plating tool 112 may form the contacts 226 in the recesses (e.g., using a CVD technique, an ALD technique, a PVD technique, an electroplating technique, and/or another type of deposition technique).

As indicated above, FIGS. 6A-6E are provided as an example. Other examples may differ from what is described with regard to FIGS. 6A-6E.

FIGS. 7A-7E are diagrams of an example implementation 700 of forming a semiconductor die described herein. In some implementations, the example implementation 700 includes an example process for forming a portion of the first semiconductor die 202. In some implementations, one or more of the semiconductor processing tools 102-114 and/or the wafer/die transport tool 116 may perform one or more of the operations described in connection with the example implementation 700. In some implementations, one or more operations described in connection with the example implementation 700 may be performed by another semiconductor processing tool.

Figure 7A:
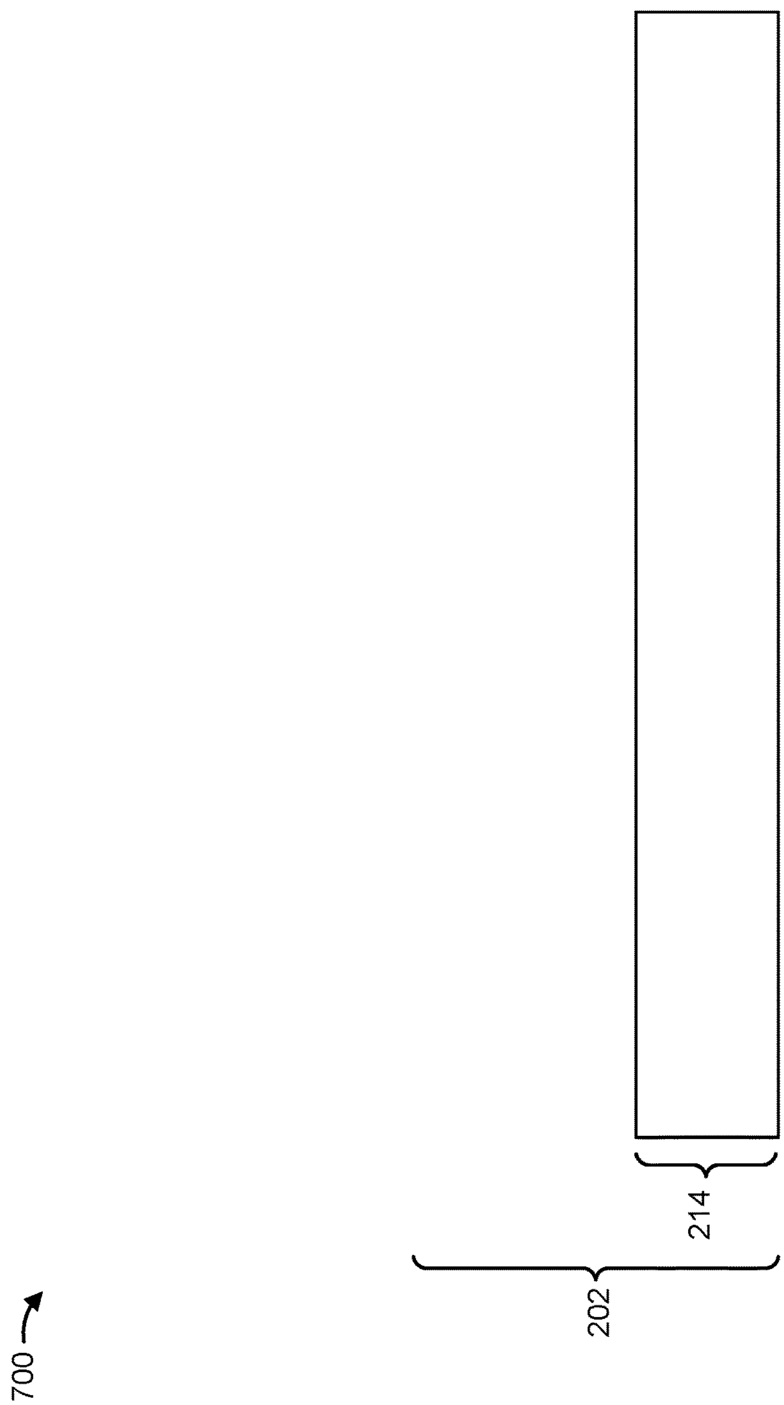
FIGS. 7A-7E are diagrams of an example implementation of forming a semiconductor die described herein.

Turning to FIG. 7A, one or more of the operations in the example implementation 700 may be performed in connection with the semiconductor substrate of the device region 210 of the first semiconductor die 202. The semiconductor substrate of the device region 214 may be provided in the form of a semiconductor wafer or another type of substrate.

Figure 7B:
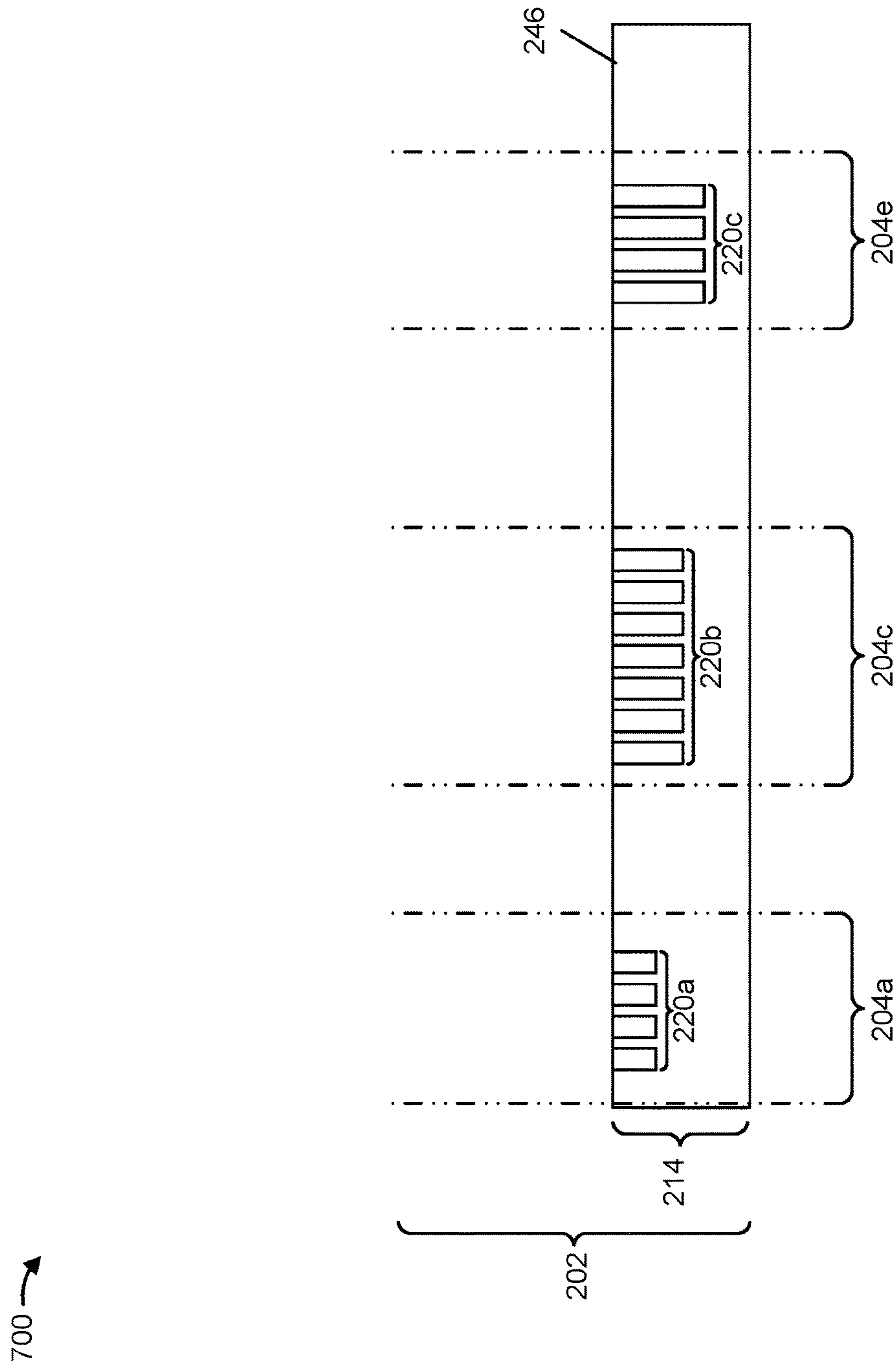

As shown in FIG. 7B, a plurality of decoupling trench capacitor structures may be formed in the device region 214. In particular, respective pluralities of decoupling trench capacitor structures may be formed in each of a plurality of decoupling trench capacitor regions in the device region 214. At least two or more of the respective pluralities of decoupling trench capacitor structures may be formed to different depths (or heights) in the device region 214 relative to the surface 246 of the semiconductor substrate of the device region 214.

As an example of the above, one or more of the semiconductor processing tools 102-114 may perform photolithography patterning operations, etching operations, deposition operations, CMP operations, and/or another type of operations to form a plurality of decoupling trench capacitor structures 220*a* in a decoupling trench capacitor region 204*a* of the device region 214, a plurality of decoupling trench capacitor structures 220*b* in a decoupling trench capacitor region 204*c* of the device region 214, and a plurality of decoupling trench capacitor structures 220*c* in a decoupling trench capacitor region 204*e* of the device region 214. In some implementations, a depth (or height) of the decoupling trench capacitor structures 220*b* in the decoupling trench capacitor region 204*c* is greater relative to a depth (or height) of the decoupling trench capacitor structures 220*a* in the decoupling trench capacitor region 204*a*. In some implementations, a depth (or height) of the decoupling trench capacitor structures 220*c* in the decoupling trench capacitor region 204*e* is greater relative to the depth (or height) of the decoupling trench capacitor structures 220*c* in the decoupling trench capacitor region 204*c*, and is greater relative to the depth (or height) of the decoupling trench capacitor structures 220*a* in the decoupling trench capacitor region 204*a*.

To form a decoupling trench capacitor structure, a recess may be formed in the semiconductor substrate (e.g., from the surface 246) of the device region 214 using a pattern in a photoresist layer, a hard mask, and/or another type of masking layer. For example, the deposition tool 102 forms a photoresist layer over the semiconductor substrate of the device region 214. The exposure tool 104 exposes the photoresist layer to a radiation source to pattern the photoresist layer. The developer tool 106 develops and removes portions of the photoresist layer to expose the pattern. The etch tool 108 etches into the semiconductor substrate of the device region 214 to form the recess. The deposition tool 102 may perform a deposition operation (e.g., a CVD operation, a PVD operation, an ALD operation) to deposit a first conductive layer 402 in the recess such that the first conductive layer 402 conforms to the shape of the recess. The deposition tool 102 may perform a deposition operation (e.g., a CVD operation, a PVD operation, an ALD operation) to deposit a first dielectric layer 404 on the first conductive layer 402. The deposition tool 102 may perform a deposition operation (e.g., a CVD operation, a PVD operation, an ALD operation) to deposit a second conductive layer 402 on the first dielectric layer 404. The deposition tool 102 may perform a deposition operation (e.g., a CVD operation, a PVD operation, an ALD operation) to deposit a second dielectric layer 404 on the second conductive layer 402. The deposition tool 102 may perform subsequent deposition operations until a sufficient or desired quantity of deep trench capacitors are formed in the recess for the deep trench capacitor structure.

Figure 7C:
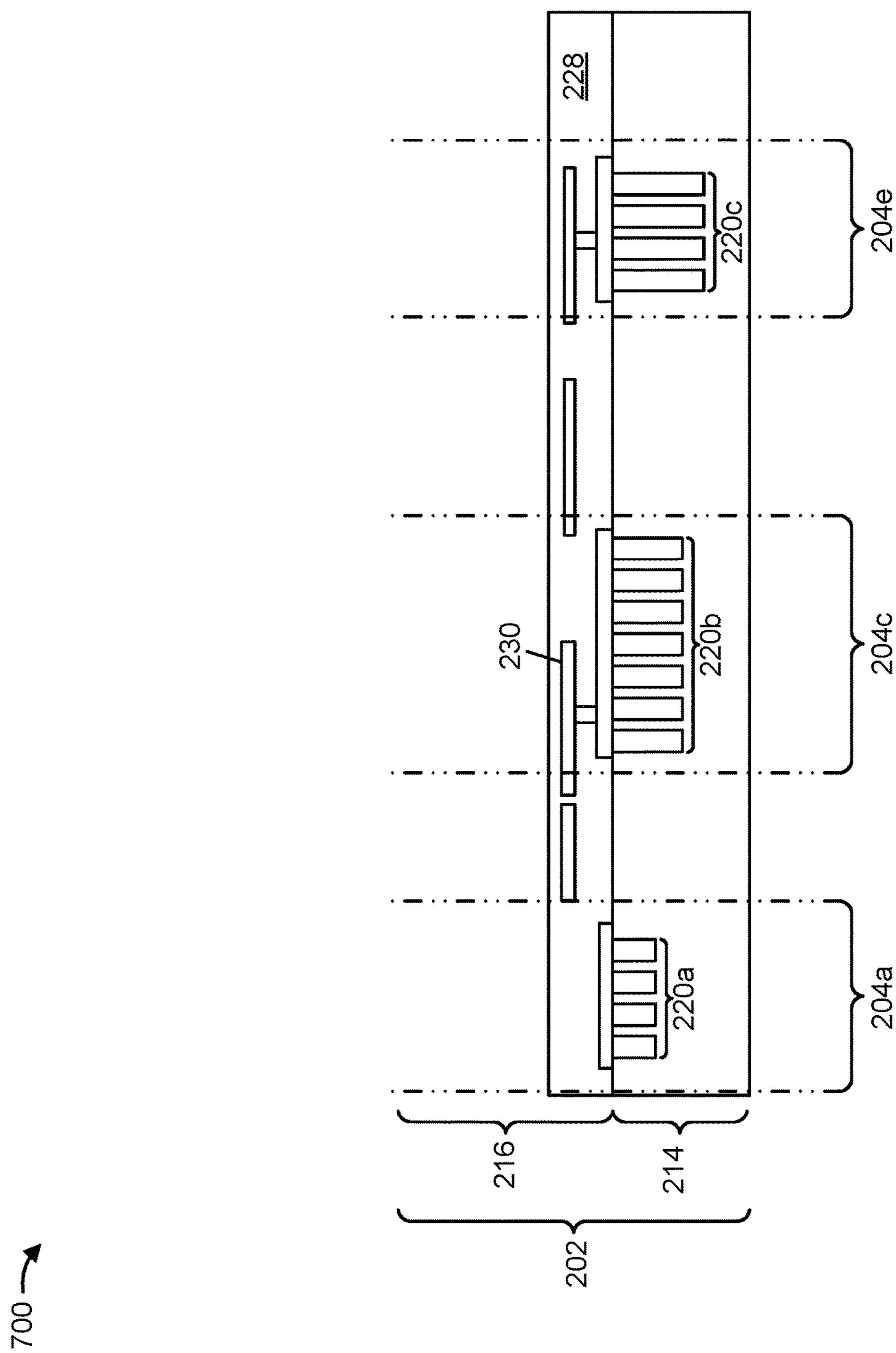
Figure 7D:
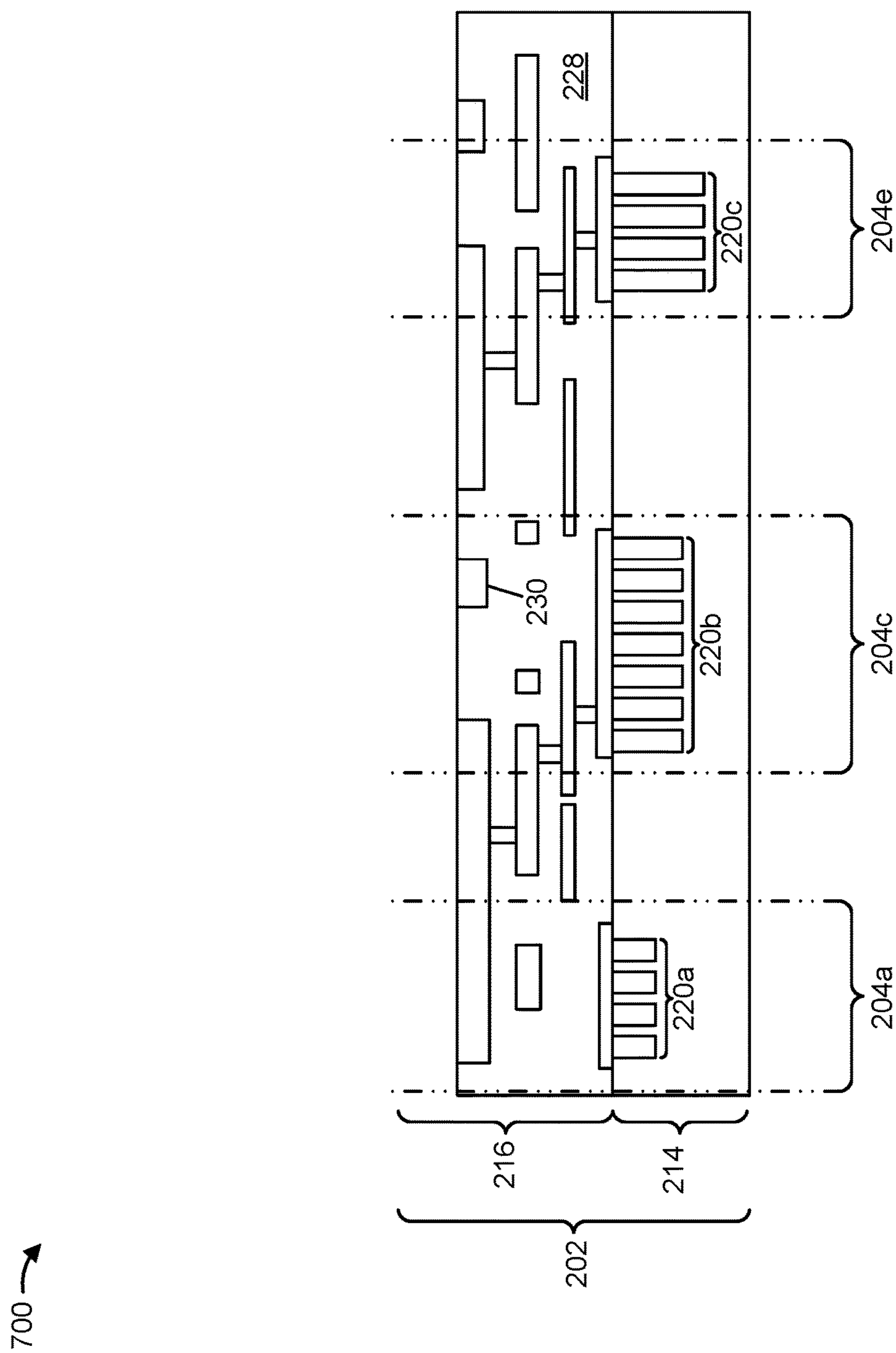
Figure 7E:
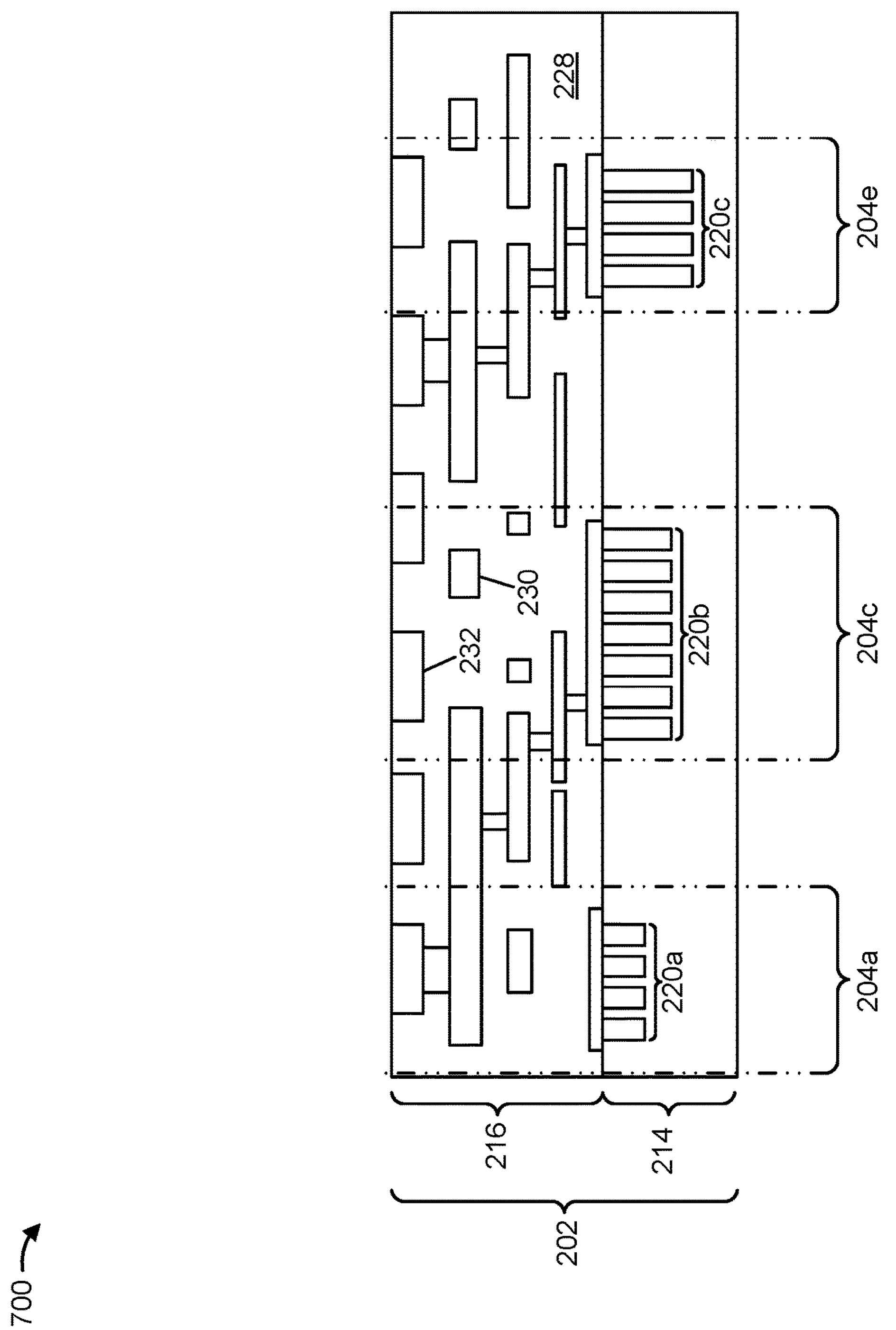

As shown in FIGS. 7C-7E, the interconnect region 216 of the first semiconductor die 202 may be formed over and/or on the semiconductor substrate of the device region 214. One or more of the semiconductor processing tools 102-114 may form the interconnect region 216 by forming one or more dielectric layers 228 and forming a plurality of metallization layers 230 in the plurality of dielectric layers 228. For example, the deposition tool 102 may deposit a first layer of the one or more dielectric layers 228 (e.g., using a CVD technique, an ALD technique, a PVD technique, and/or another type of deposition technique), the etch tool 108 may remove portions of the first layer to form recesses in the first layer, and the deposition tool 102 and/or the plating tool 112 may form a first metallization layer of the plurality of metallization layers 230 in the recesses (e.g., using a CVD technique, an ALD technique, a PVD technique, an electroplating technique, and/or another type of deposition technique). The deposition tool 102, the etch tool 108, the plating tool 112, and/or another semiconductor processing tool may continue to perform similar processing operations to forming the interconnect region 216 until a sufficient or desired arrangement of metallization layers 230 is achieved.

The decoupling trench capacitor structures 220*a* in the decoupling trench capacitor region 204*a* may be electrically connected and/or physically connected with one or more of the metallization layers 230. The decoupling trench capacitor structures 220*b* in the decoupling trench capacitor region 204*c* may be electrically connected and/or physically connected with one or more of the metallization layers 230. The decoupling trench capacitor structures 220*c* in the decoupling trench capacitor region 204*e* may be electrically connected and/or physically connected with one or more of the metallization layers 230.

As shown in FIG. 7E, one or more of the semiconductor processing tools 102-114 may form another layer of the one or more dielectric layers 228, and may form a plurality of contacts 232 in the layer such that the contacts 232 are electrically connected and/or physically connected with one or more of the metallization layers 230. For example, the deposition tool 102 may deposit the layer of the one or more dielectric layers 228 (e.g., using a CVD technique, an ALD technique, a PVD technique, and/or another type of deposition technique), the etch tool 108 may remove portions of the layer to form recesses in the layer, and the deposition tool 102 and/or the plating tool 112 may form the contacts 232 in the recesses (e.g., using a CVD technique, an ALD technique, a PVD technique, an electroplating technique, and/or another type of deposition technique).

As indicated above, FIGS. 7A-7E are provided as an example. Other examples may differ from what is described with regard to FIGS. 7A-7E.

FIGS. 8A-8E are diagrams of an example implementation 800 of forming a semiconductor die described herein. In some implementations, the example implementation 800 includes an example process for forming another portion the first semiconductor die 202. In some implementations, one or more of the semiconductor processing tools 102-114 and/or the wafer/die transport tool 116 may perform one or more of the operations described in connection with the example implementation 800. In some implementations, one or more operations described in connection with the example implementation 800 may be performed by another semiconductor processing tool.

Figure 8A:
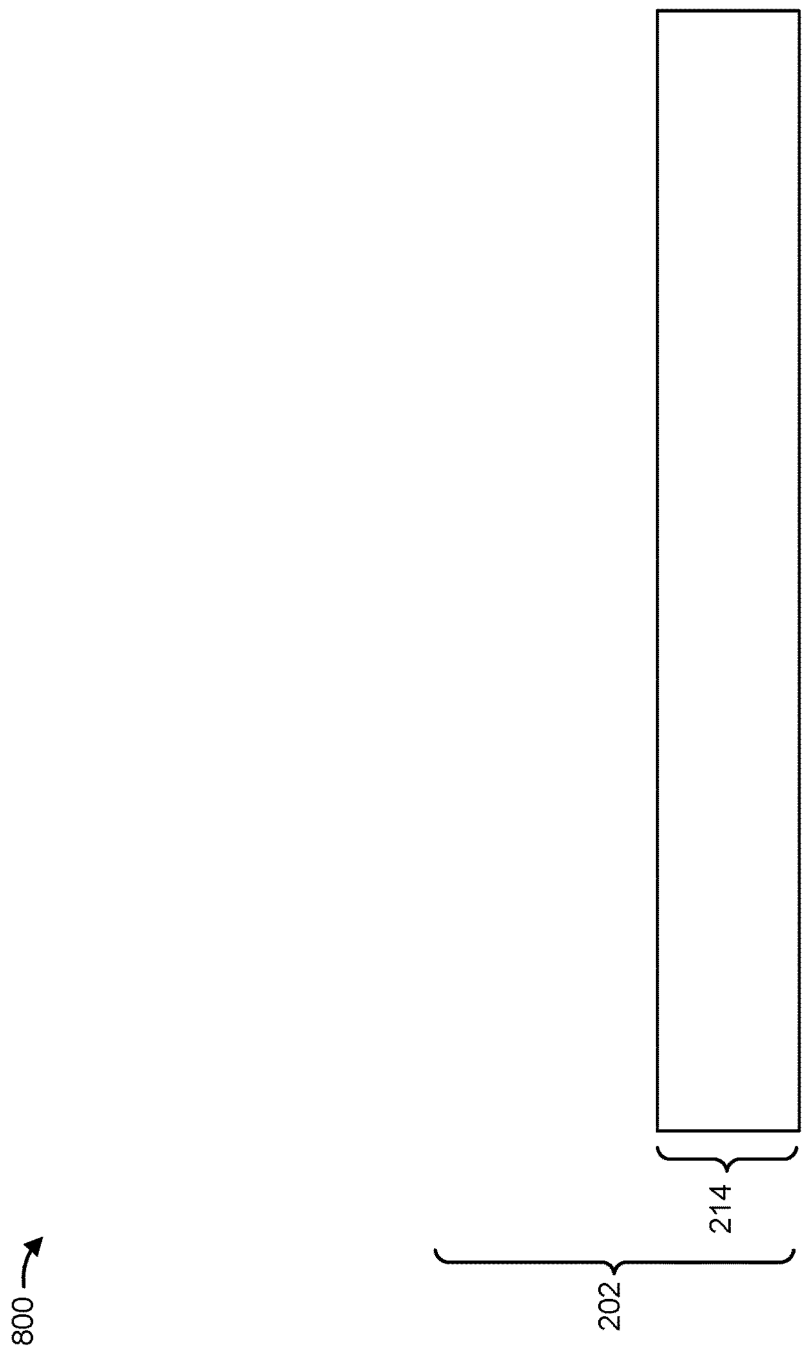
FIGS. 8A-8E are diagrams of an example implementation of forming a semiconductor die described herein.

Turning to FIG. 8A, one or more of the operations in the example implementation 800 may be performed in connection with the semiconductor substrate of the device region 214 of the first semiconductor die 202. The semiconductor substrate of the device region 214 may be provided in the form of a semiconductor wafer or another type of substrate.

Figure 8B:
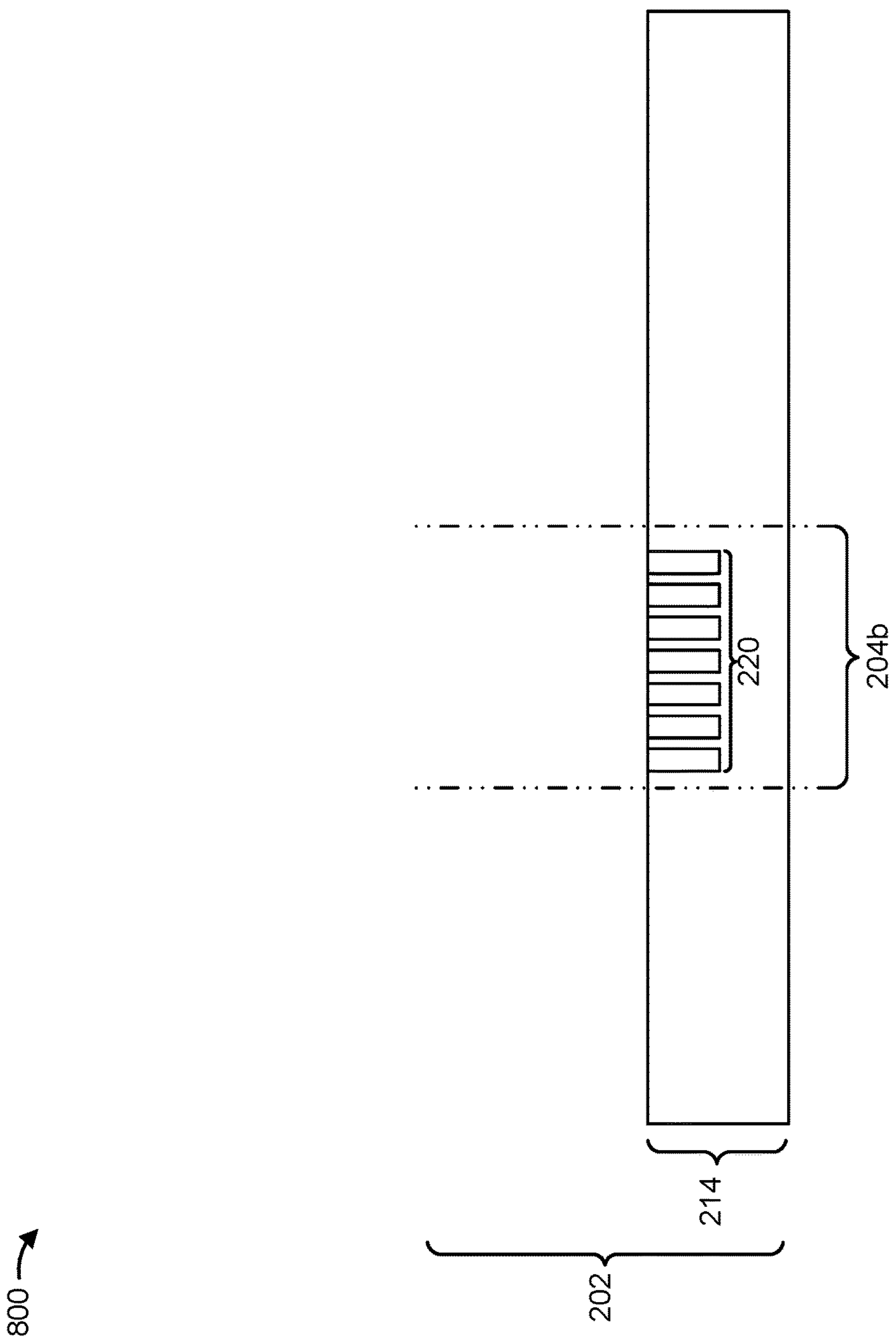

As shown in FIG. 8B, a plurality of decoupling trench capacitor structures 220 may be formed in a decoupling trench capacitor region 204*b* of the device region 214. To form a decoupling trench capacitor structure, a recess may be formed in the semiconductor substrate of the device region 214 using a pattern in a photoresist layer, a hard mask, and/or another type of masking layer. For example, the deposition tool 102 forms a photoresist layer over the semiconductor substrate of the device region 214. The exposure tool 104 exposes the photoresist layer to a radiation source to pattern the photoresist layer. The developer tool 106 develops and removes portions of the photoresist layer to expose the pattern. The etch tool 108 etches into the semiconductor substrate of the device region 214 to form the recess. The deposition tool 102 may perform a deposition operation (e.g., a CVD operation, a PVD operation, an ALD operation) to deposit a first conductive layer 402 in the recess such that the first conductive layer 402 conforms to the shape of the recess. The deposition tool 102 may perform a deposition operation (e.g., a CVD operation, a PVD operation, an ALD operation) to deposit a first dielectric layer 404 on the first conductive layer 402. The deposition tool 102 may perform a deposition operation (e.g., a CVD operation, a PVD operation, an ALD operation) to deposit a second conductive layer 402 on the first dielectric layer 404. The deposition tool 102 may perform a deposition operation (e.g., a CVD operation, a PVD operation, an ALD operation) to deposit a second dielectric layer 404 on the second conductive layer 402. The deposition tool 102 may perform subsequent deposition operations until a sufficient or desired quantity of deep trench capacitors are formed in the recess for the deep trench capacitor structure.

Figure 8C:
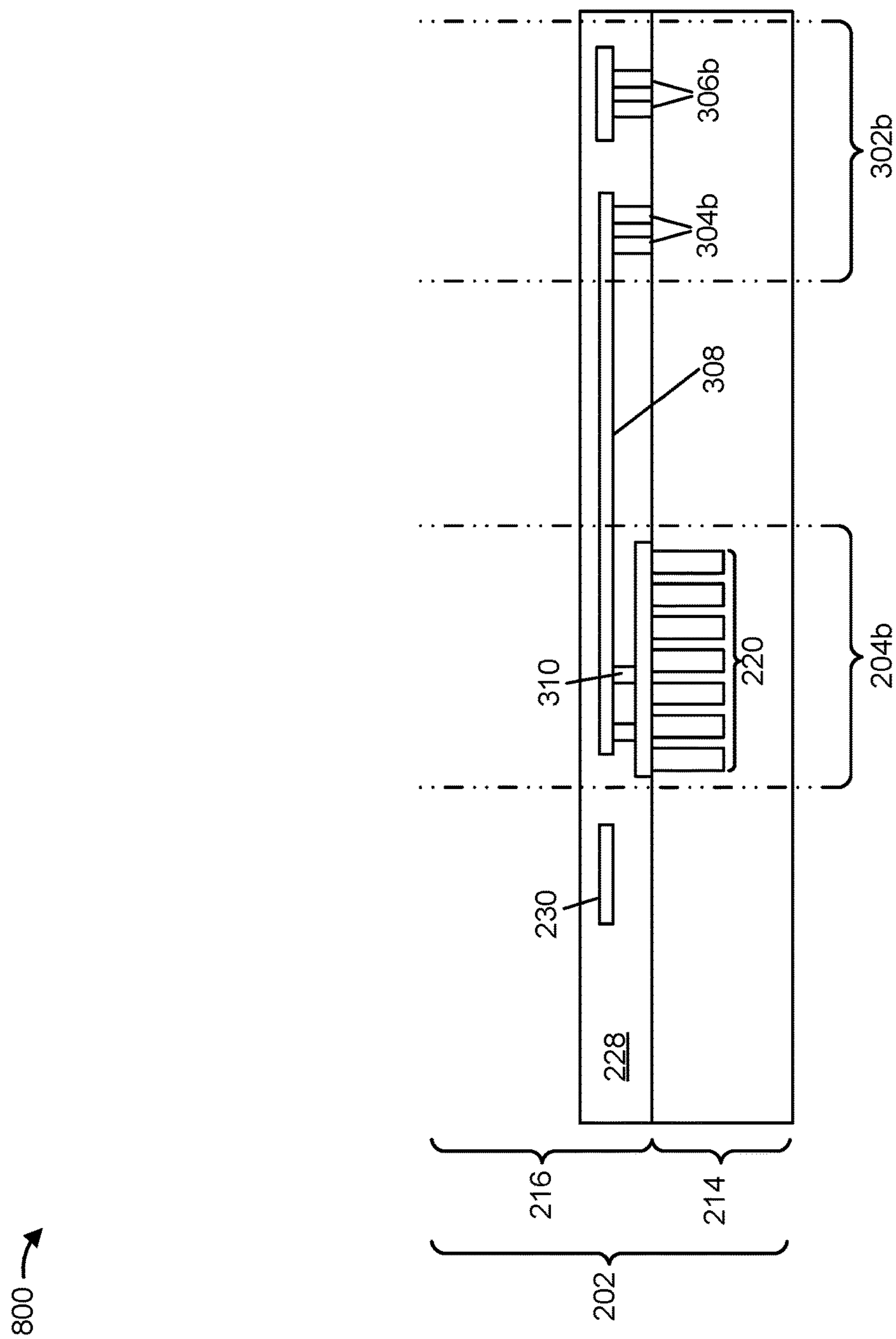
Figure 8D:
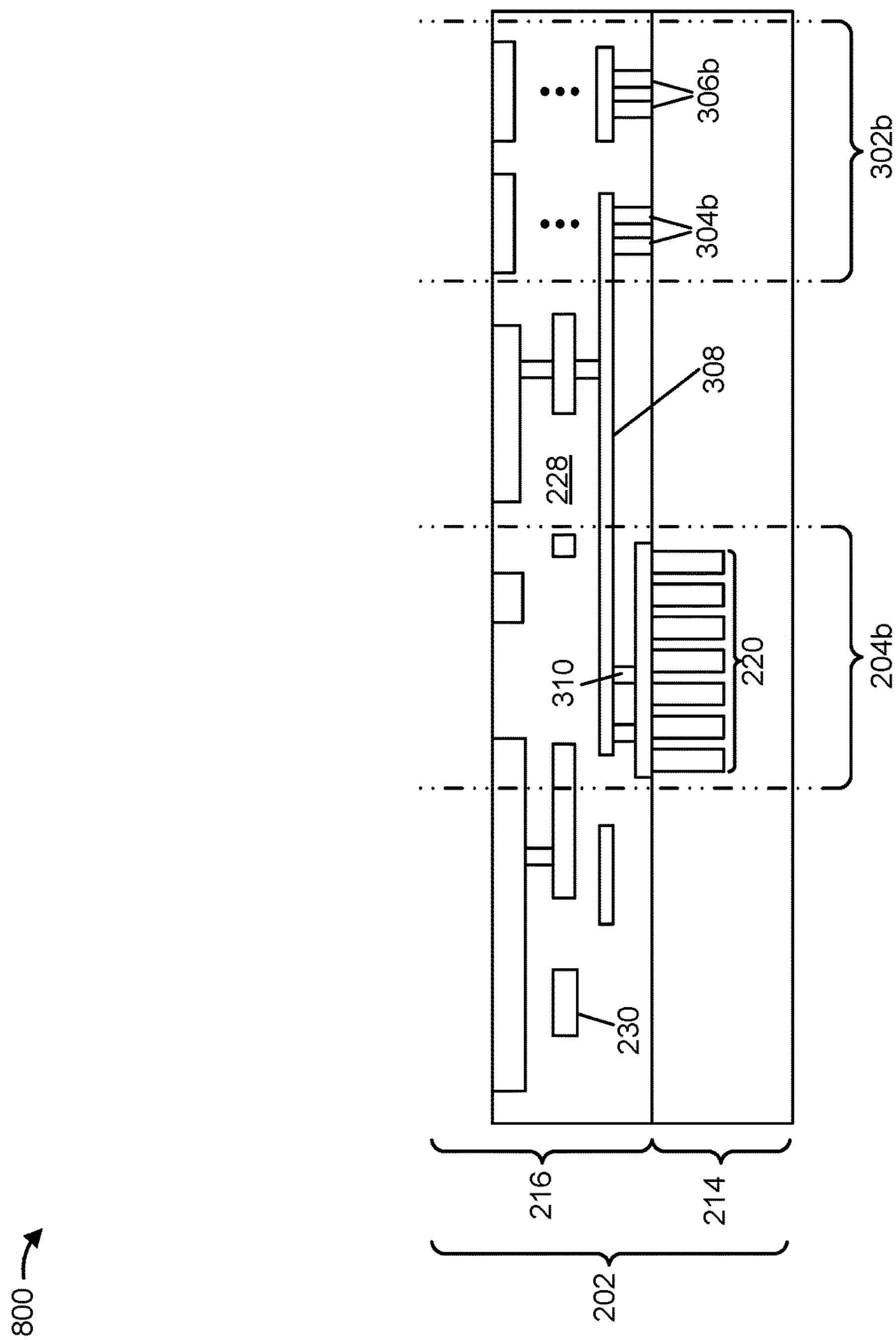
Figure 8E:
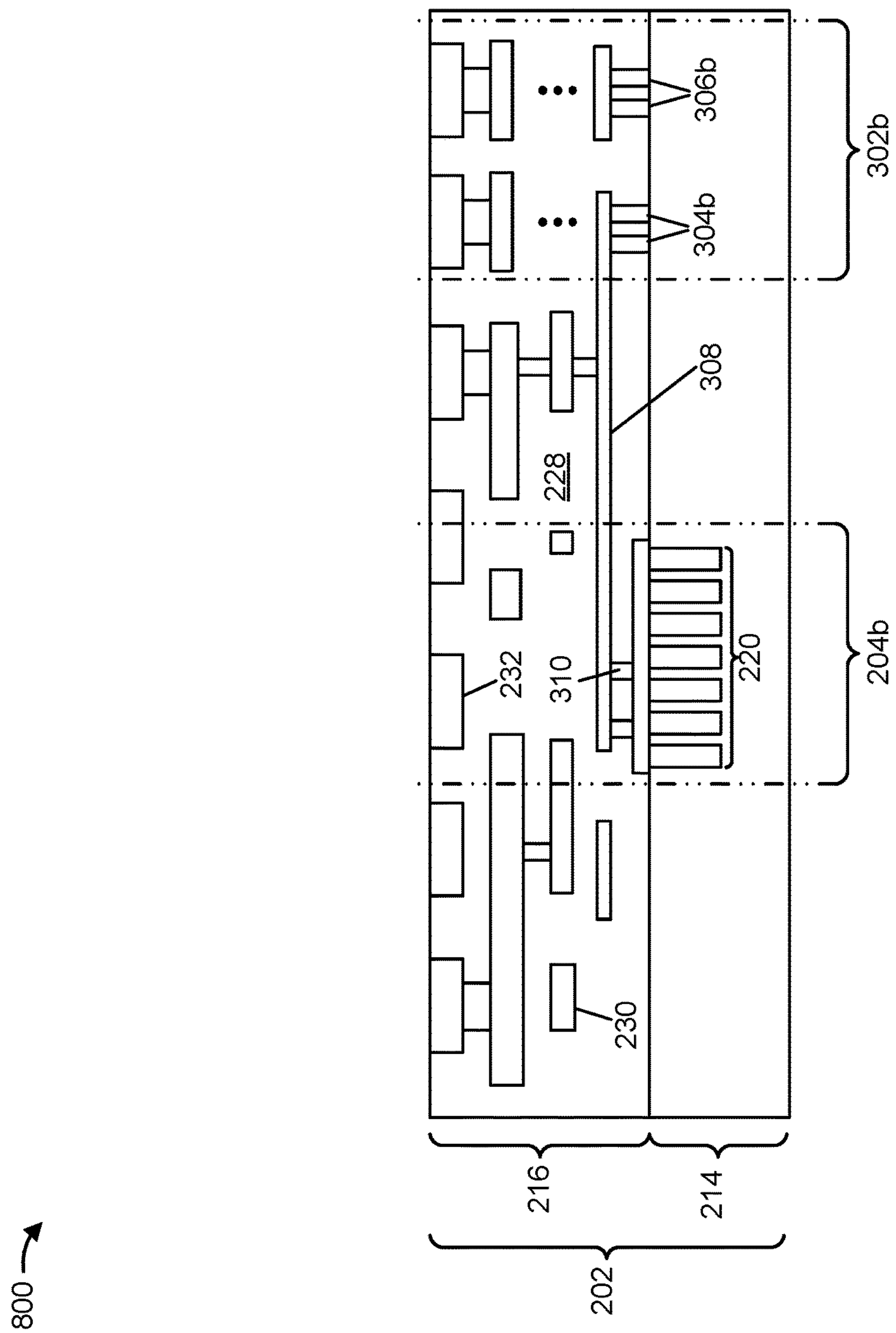

As shown in FIGS. 8C-8E, the interconnect region 216 of the first semiconductor die 202 may be formed over and/or on the semiconductor substrate of the device region 214. One or more of the semiconductor processing tools 102-114 may form the interconnect region 216 by forming one or more dielectric layers 228 and forming a plurality of metallization layers 230 in the plurality of dielectric layers 228. For example, the deposition tool 102 may deposit a first layer of the one or more dielectric layers 228 (e.g., using a CVD technique, an ALD technique, a PVD technique, and/or another type of deposition technique), the etch tool 108 may remove portions of the first layer to form recesses in the first layer, and the deposition tool 102 and/or the plating tool 112 may form a first metallization layer of the plurality of metallization layers 230 in the recesses (e.g., using a CVD technique, an ALD technique, a PVD technique, an electroplating technique, and/or another type of deposition technique). At least a portion of the first metallization layer may be electrically connected and/or physically connected with the decoupling trench capacitor structures 220. The deposition tool 102, the etch tool 108, the plating tool 112, and/or another semiconductor processing tool may continue to perform similar processing operations to forming the interconnect region 212 until a sufficient or desired arrangement of metallization layers 230 is achieved.

As further shown in FIG. 8C-8E, a plurality of structures may be formed in a portion 302*b* of a seal ring structure 302 in the interconnect region 216. For example, a portion 304*b* of an inner seal ring structure 304 of the seal ring structure 302 may be formed in the interconnect region 212. As another example, a portion 306*b* of an outer seal ring structure 306 of the seal ring structure 302 may be formed in the interconnect region 212. Forming the portions 304*b* and 306*b* may include forming a plurality of metallization layers 230 in the one or more dielectric layers 228 of the interconnect region 216. For example, the deposition tool 102 may deposit a first layer of the one or more dielectric layers 228 (e.g., using a CVD technique, an ALD technique, a PVD technique, and/or another type of deposition technique), the etch tool 108 may remove portions of the first layer to form recesses in the first layer, and the deposition tool 102 and/or the plating tool 112 may form a first metallization layer of the plurality of metallization layers 230 in the recesses (e.g., using a CVD technique, an ALD technique, a PVD technique, an electroplating technique, and/or another type of deposition technique) for the portions 304*b* and 306*b* in the portion 302*b* of the seal ring structure 302. The deposition tool 102, the etch tool 108, the plating tool 112, and/or another semiconductor processing tool may continue to perform similar processing operations to forming the interconnect region 216 until a sufficient or desired arrangement of metallization layers 230 in the portions 304*b* and 306*b* in the portion 302*b* of the seal ring structure 302 is achieved.

As further shown in FIGS. 8C-8E, conductive lines 310 and the metallization layers 308 may be formed in the one or more dielectric layers 228. The conductive lines 310 and metallization layers 308 may electrically connect and/or physically connect the decoupling trench capacitor structures 220 in the decoupling trench capacitor region 204*b* with the portion 302*b* of the seal ring structure 302. In particular, the conductive lines 310 and the metallization layers 308 may electrically connect and/or physically connect the decoupling trench capacitor structures 220 in the decoupling trench capacitor region 204*b* with the portion 302*b* of the inner seal ring structure 304 of the seal ring structure 302.

As shown in FIG. 8E, one or more of the semiconductor processing tools 102-114 may form another layer of the one or more dielectric layers 228, and may form a plurality of contacts 232 in the layer such that the contacts 232 are electrically connected and/or physically connected with one or more of the metallization layers 230. For example, the deposition tool 102 may deposit the layer of the one or more dielectric layers 228 (e.g., using a CVD technique, an ALD technique, a PVD technique, and/or another type of deposition technique), the etch tool 108 may remove portions of the layer to form recesses in the layer, and the deposition tool 102 and/or the plating tool 112 may form the contacts 232 in the recesses (e.g., using a CVD technique, an ALD technique, a PVD technique, an electroplating technique, and/or another type of deposition technique).

As indicated above, FIGS. 8A-8E are provided as an example. Other examples may differ from what is described with regard to FIGS. 8A-8E.

FIGS. 9A-9G are diagrams of an example implementation 900 of forming a portion of a semiconductor die package 200 described herein. In some implementations, one or more operations described in connection with FIGS. 9A-9D may be performed by one or more of the semiconductor processing tools 102-114 and/or the wafer/die transport tool 116. In some implementations, one or more operations described in connection with FIGS. 9A-9D may be performed by another semiconductor processing tool.

Figure 9A:
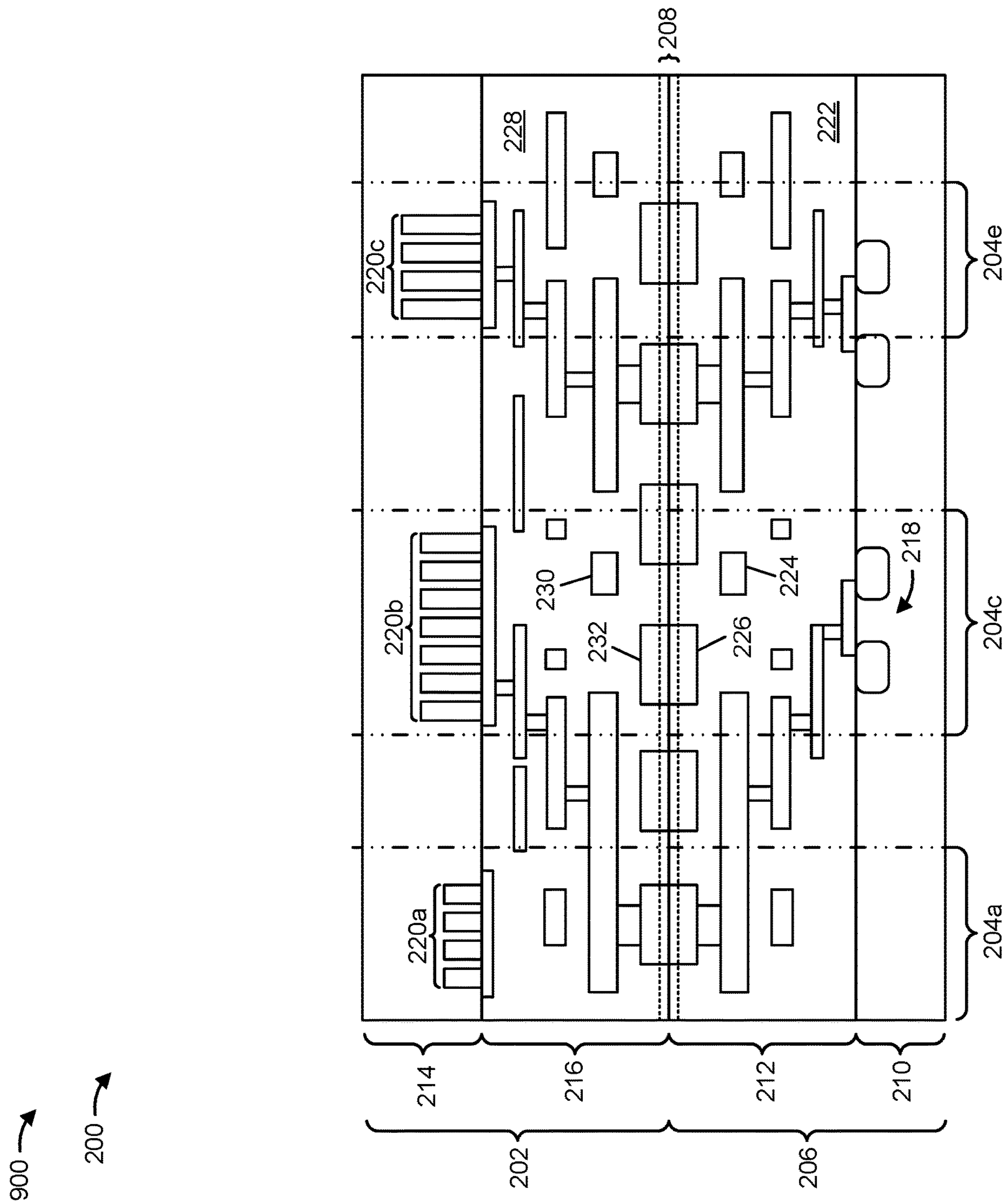
FIGS. 9A-9G are diagrams of an example implementation of forming a portion of a semiconductor die package described herein.

As shown in FIG. 9A, the first semiconductor die 202 and the second semiconductor die 204 may be bonded at the bonding interface 208 such that the first semiconductor die 202 and the second semiconductor die 206 are vertically arranged or stacked. The first semiconductor die 202 and the second semiconductor die 206 may be vertically arranged or stacked in a WoW configuration, a die on wafer configuration, a die on die configuration, and/or another direct bonding configuration. The bonding tool 114 may perform a bonding operation to bond the first semiconductor die 202 and the second semiconductor die 206 at the bonding interface 208. The bonding operation may include a direct bonding operation in which bonding of first semiconductor die 202 and the second semiconductor die 206 is achieved through the physical connection of the contacts 226 with the contacts 232. At the bonding interface 208, a direct metal bonding is formed between the contacts 226/232, and a direct dielectric bond is formed between two dielectric layers.

Figure 9B:
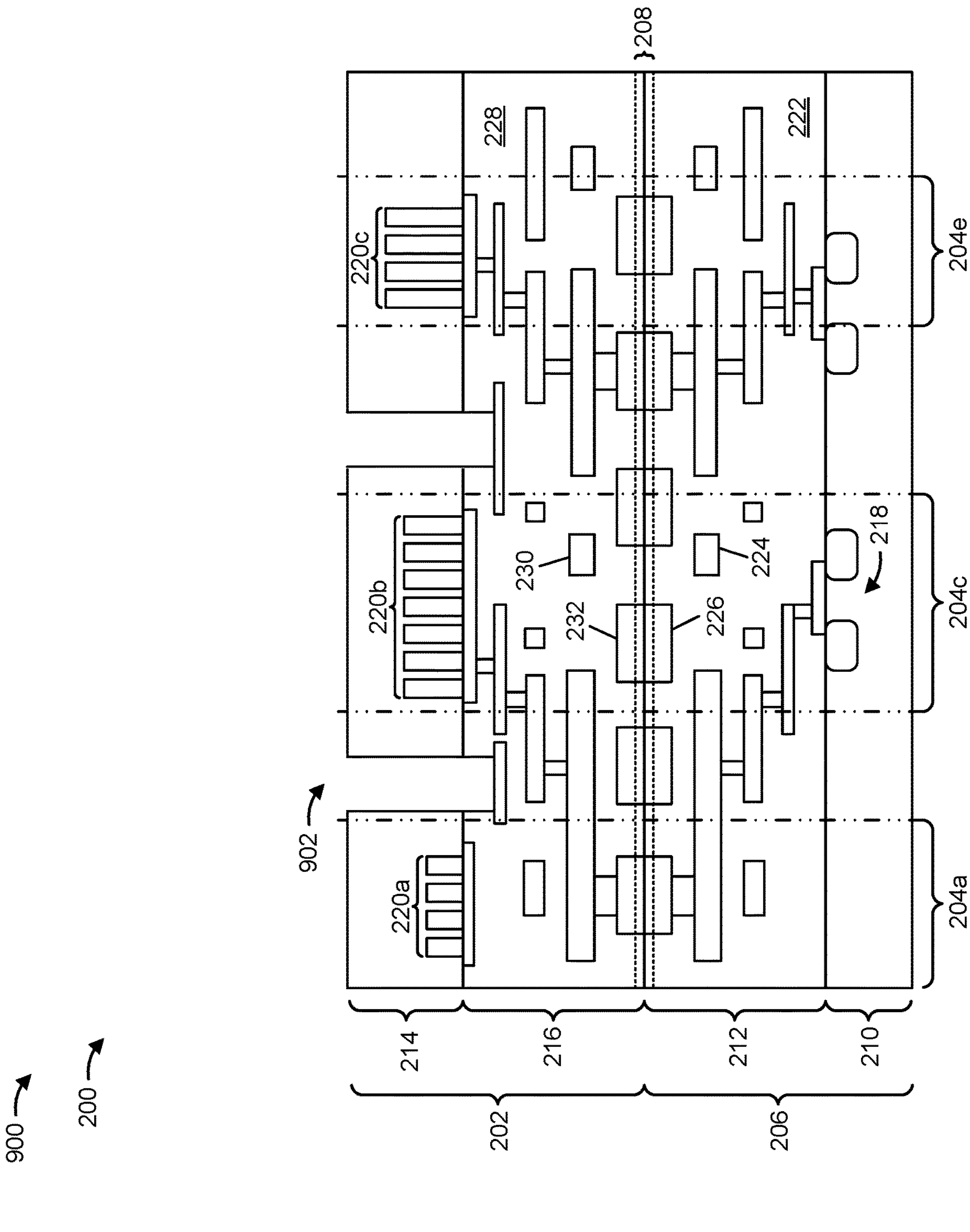

As shown in FIG. 9B, one or more recesses 902 may be formed through the semiconductor substrate of the device region 214 and into a portion of the dielectric layer 228 of the interconnect region 216. The one or more recesses 902 may be formed to expose one or more portions of a metallization layer 230 in the interconnection region 216. Thus, the one or more recesses 902 may be formed over the one or more portions of a metallization layer 230.

In some implementations, a pattern in a photoresist layer is used to form the one or more recesses 902. In these implementations, the deposition tool 102 forms the photoresist layer over the silicon substrate of the device region 214. The exposure tool 104 exposes the photoresist layer to a radiation source to pattern the photoresist layer. The developer tool 106 develops and removes portions of the photoresist layer to expose the pattern. The etch tool 108 etches through the semiconductor substrate of the device region 214 and into a portion of the dielectric layer 228 of the interconnect region 216 to form the one or more recesses 902. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the one or more recesses 902 based on a pattern.

Figure 9C:
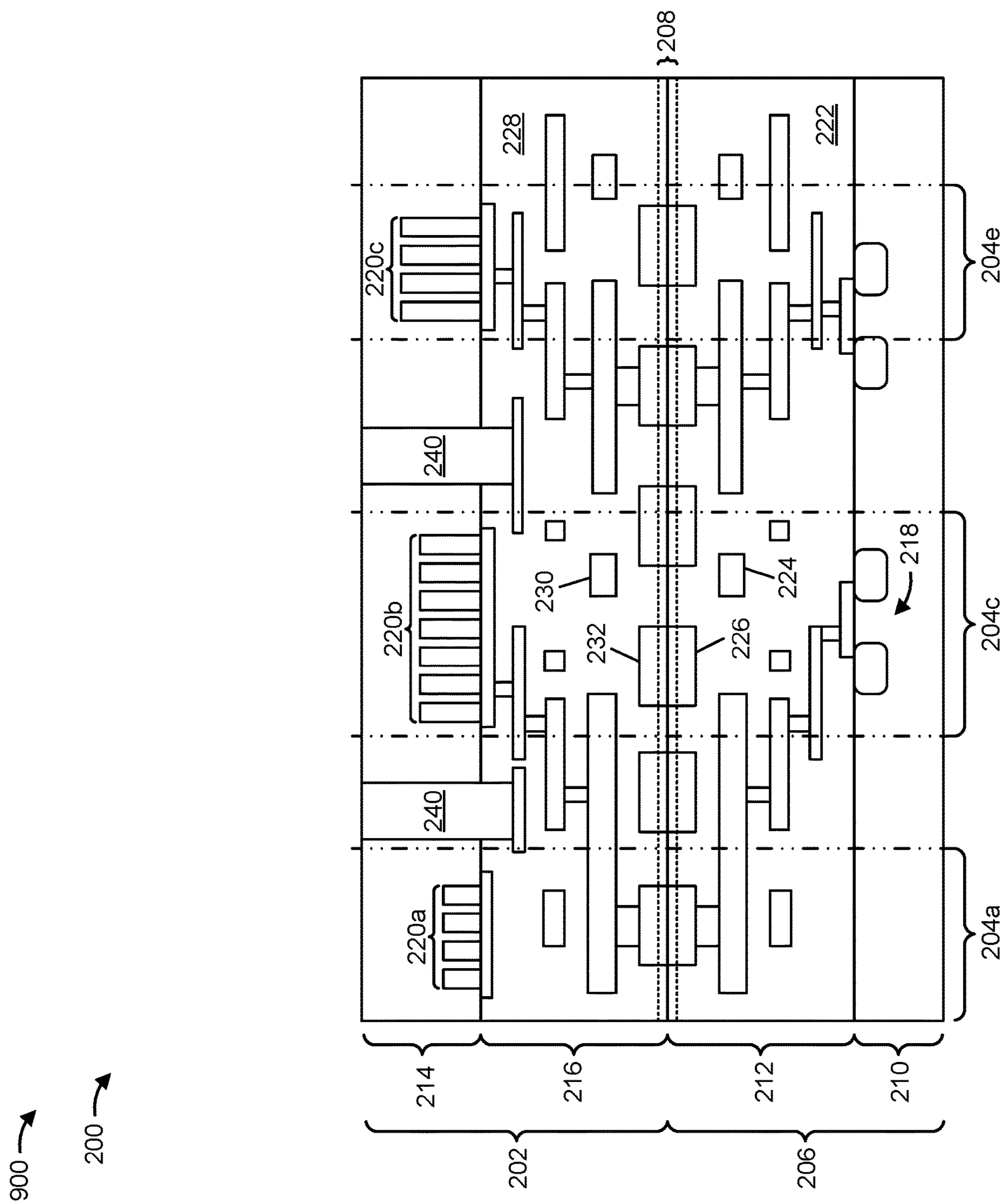

As shown in FIG. 9C, one or more BTSV structures 240 may be formed in the one or more recesses 902. In this way, the one or more BTSV structures 240 extend through the semiconductor substrate the device region 214 and into the interconnect region 216. The one or more BTSV structures 240 may be electrically connected and/or physically connected with the one or more portions of the metallization layer 230 that were exposed through the one or more recesses 902.

The deposition tool 102 and/or the plating tool 112 may deposit the one or more BTSV structures 240 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the one or more BTSV structures 240 after the one or more BTSV structures 240 are deposited.

Figure 9D:
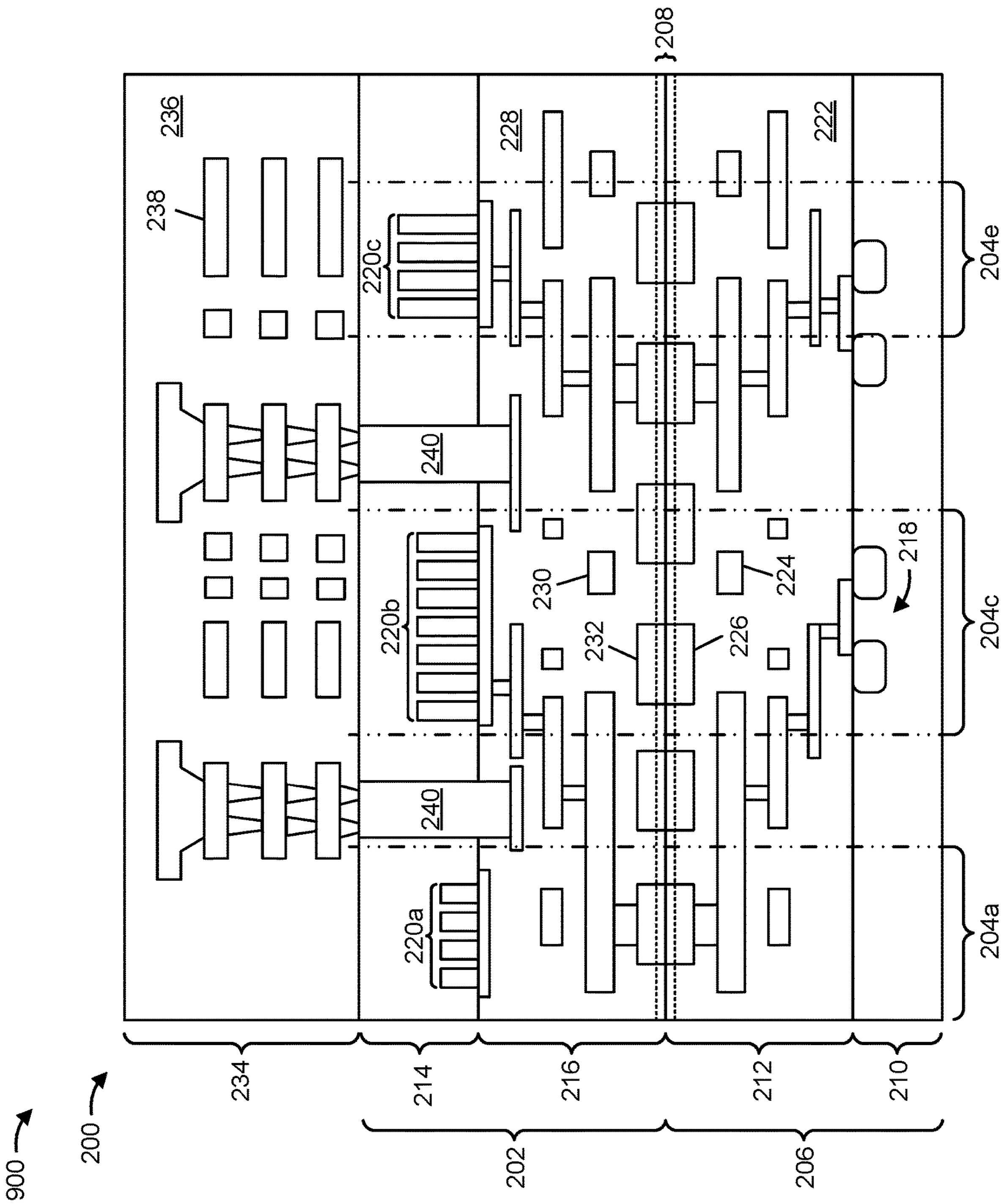

As shown in FIG. 9D, the redistribution structure 234 of the semiconductor die package 200 may be formed over the first semiconductor die 202. One or more of the semiconductor processing tools 102-114 may form the redistribution structure 234 by forming one or more dielectric layers 236 and forming a plurality of metallization layers 238 in the plurality of dielectric layers 236. For example, the deposition tool 102 may deposit a first layer of the one or more dielectric layers 236 (e.g., using a CVD technique, an ALD technique, a PVD technique, and/or another type of deposition technique), the etch tool 108 may remove portions of the first layer to form recesses in the first layer, and the deposition tool 102 and/or the plating tool 112 may form a first metallization layer of the plurality of metallization layers 238 in the recesses (e.g., using a CVD technique, an ALD technique, a PVD technique, an electroplating technique, and/or another type of deposition technique). At least a portion of the first metallization layer may be electrically connected and/or physically connected with the one or more BTSV structures 240. The deposition tool 102, the etch tool 108, the plating tool 112, and/or another semiconductor processing tool may continue to perform similar processing operations to forming the redistribution structure 234 until a sufficient or desired arrangement of metallization layers 238 is achieved.

Figure 9E:
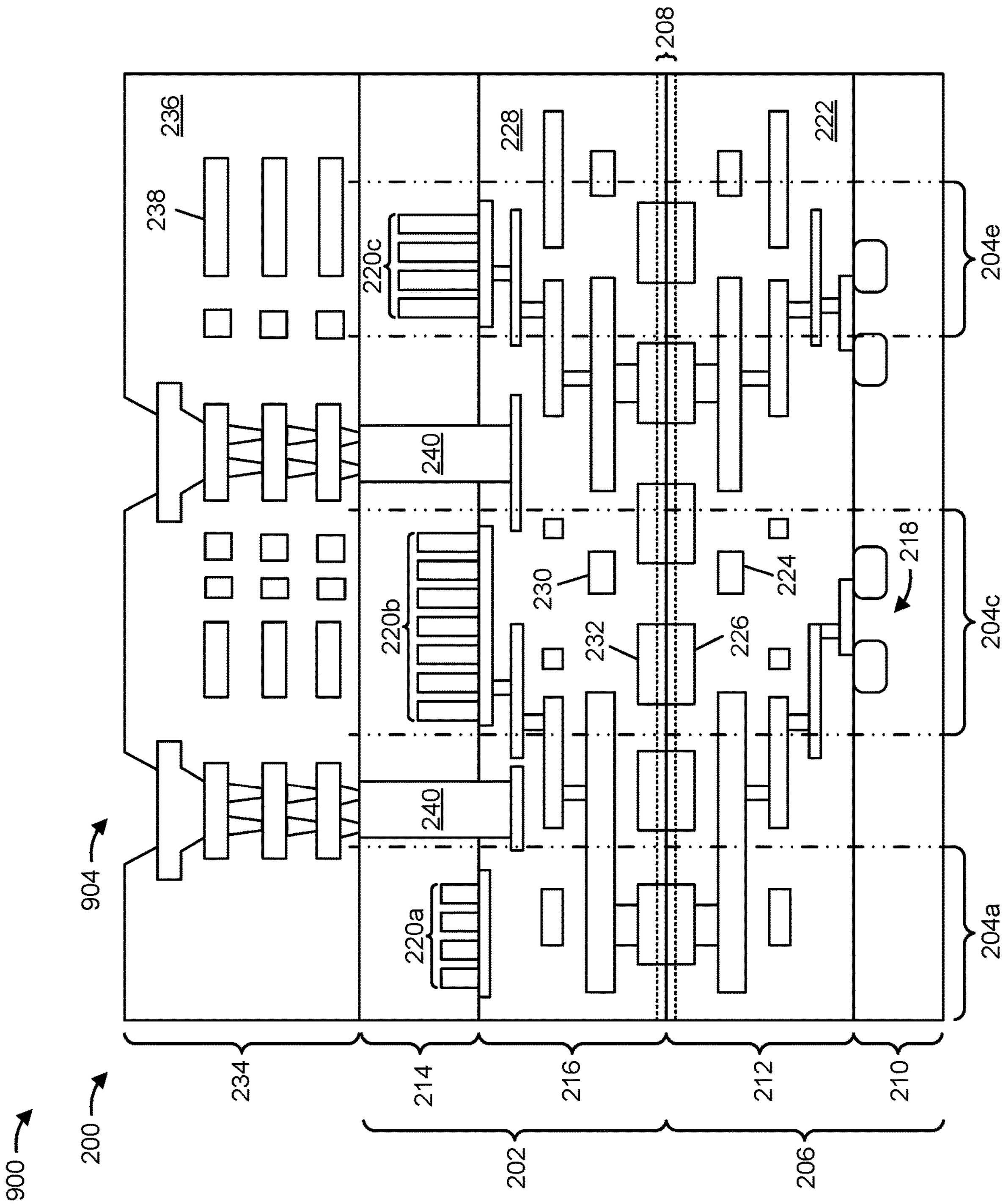

As shown in FIG. 9E, recesses 904 may be formed in the one or more dielectric layers 236. The recesses 904 may be formed to expose portions of a metallization layer 238 in the redistribution structure 234. Thus, the recesses 904 may be formed over the one or more portions of a metallization layer 238.

In some implementations, a pattern in a photoresist layer is used to form the recesses 902. In these implementations, the deposition tool 102 forms the photoresist layer on the one or more dielectric layers 236. The exposure tool 104 exposes the photoresist layer to a radiation source to pattern the photoresist layer. The developer tool 106 develops and removes portions of the photoresist layer to expose the pattern. The etch tool 108 etches into the one or more dielectric layers 236 to form the recesses 902. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 904 based on a pattern.

Figure 9F:
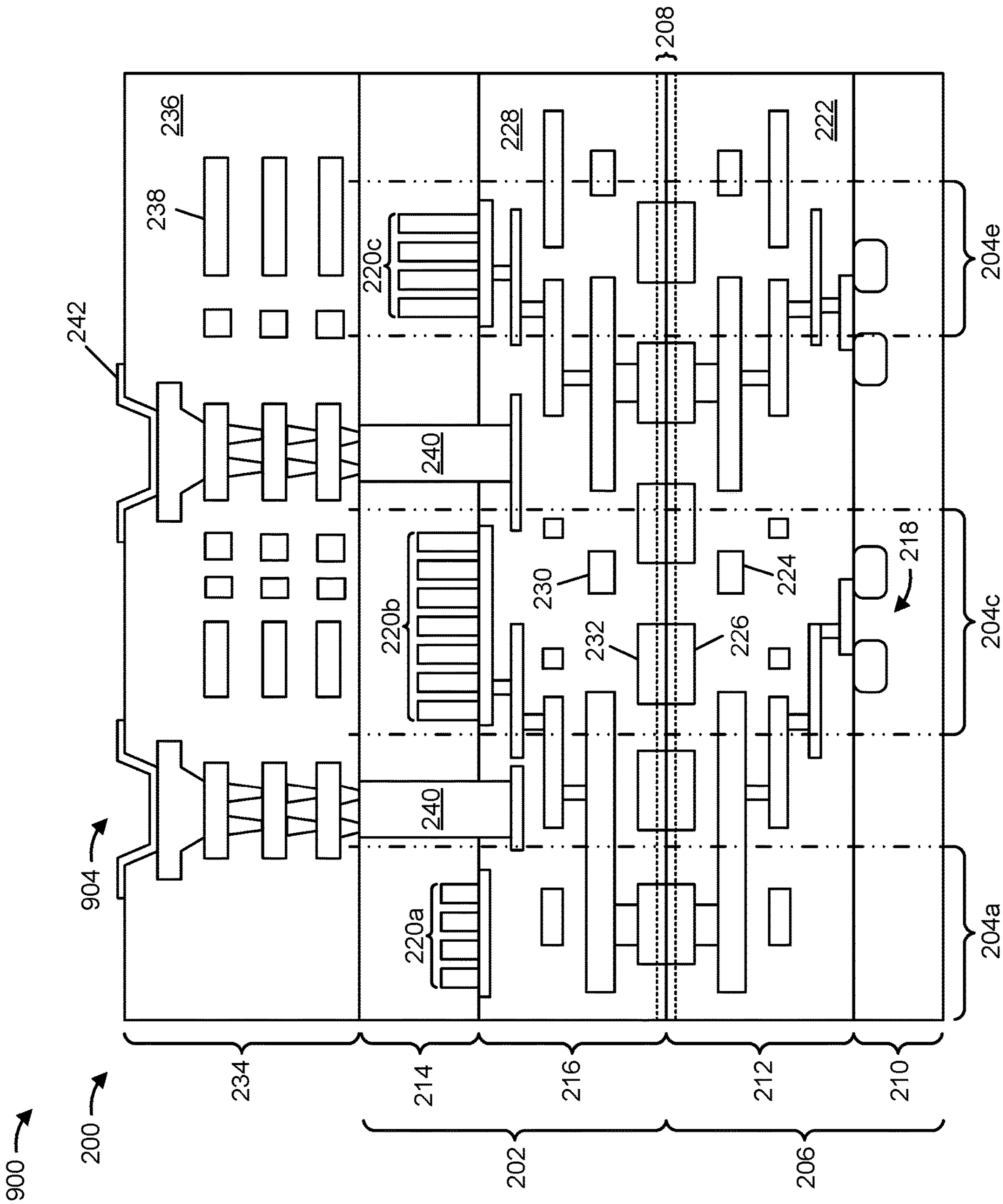

As shown in FIG. 9F, UBM layers 242 may be formed in the recesses 904. The deposition tool 102 and/or the plating tool 112 may deposit the UBM layers 242 using a CVD technique, a PVD technique, an ALD technique, an electroplating technique, another deposition technique described above in connection with FIG. 1, and/or a deposition technique other than as described above in connection with FIG. 1. In some implementations, a continuous layer of conductive material is deposited on the top surface of the redistribution structure 234, including in the recess 902. The continuous layer of conductive material is then patterned (e.g., by the deposition tool 102, the exposure tool 104, and the developer tool 106) to form a pattern on the continuous layer of the conductive material, and the etch tool 108 removes portions of the continuous layer of the conductive material based on the pattern. Remaining portions of the continuous layer of the conductive material may correspond to the UBM layers 242.

Figure 9G:
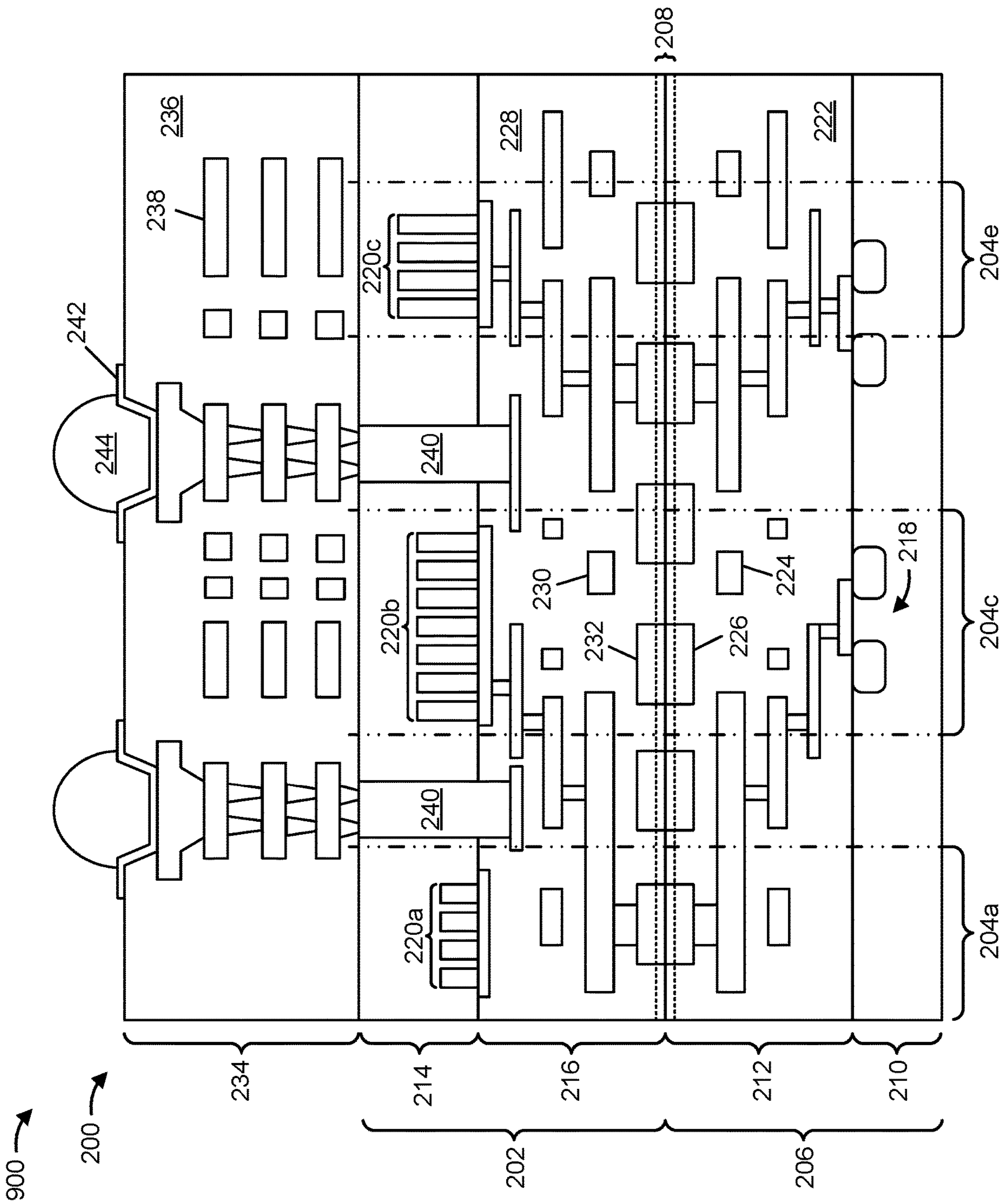

As shown in FIG. 9G, conductive terminals 244 may be formed in the recesses 904 over the UBM layers 242. In some implementations, the plating tool 112 forms the conductive terminals 244 using an electroplating technique. In some implementations, solder is dispensed in the recesses 904 to form the conductive terminals 244.

As indicated above, FIGS. 9A-9G are provided as an example. Other examples may differ from what is described with regard to FIGS. 9A-9G.

Figure 10:
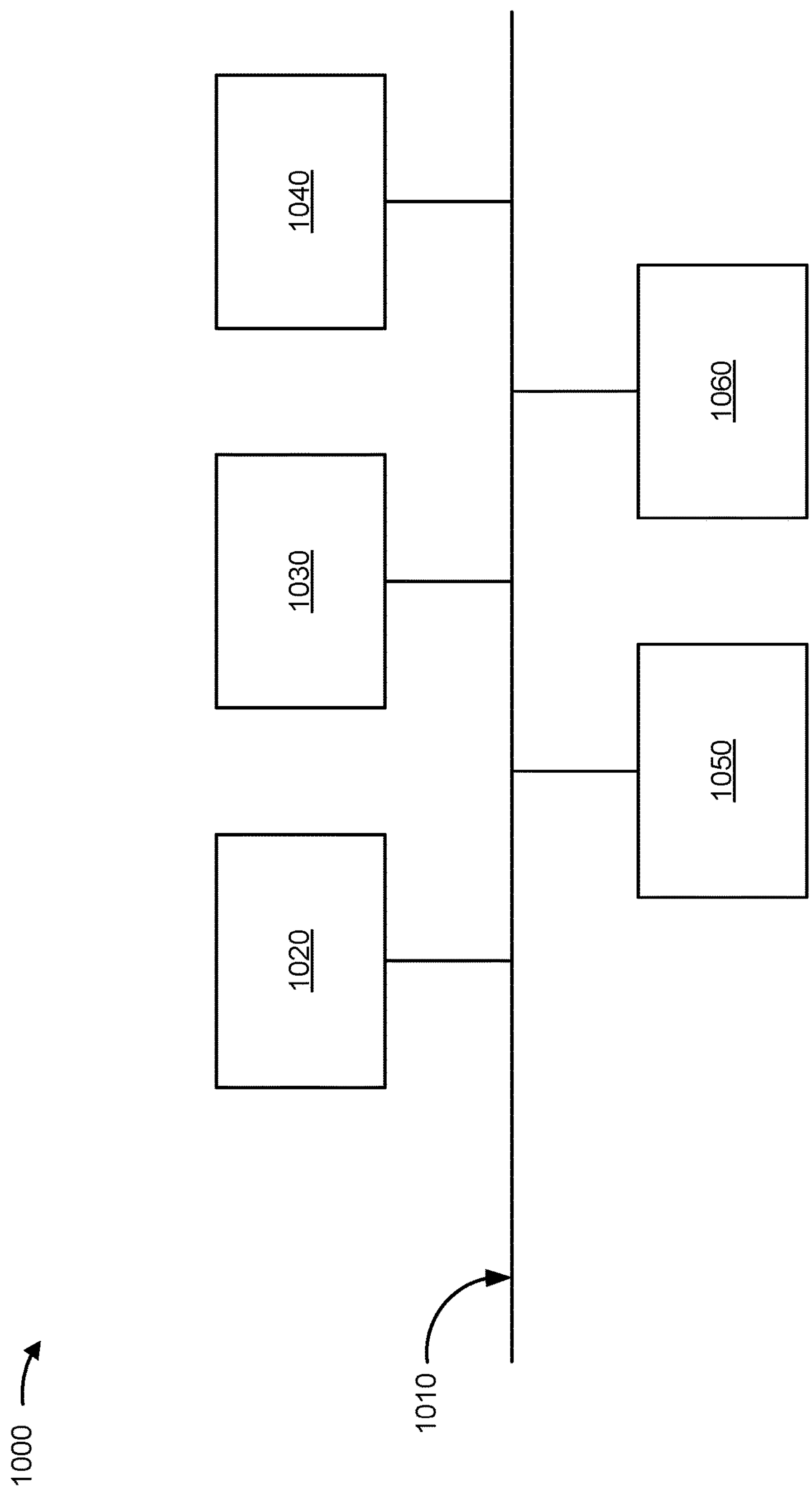
FIG. 10 is a diagram of example components of a device described herein.

FIG. 10 is a diagram of example components of a device 1000 described herein. In some implementations, one or more of the semiconductor processing tools 102-114 and/or the wafer/die transport tool 116 may include one or more devices 1000 and/or one or more components of the device 1000. As shown in FIG. 10, the device 1000 may include a bus 1010, a processor 1020, a memory 1030, an input component 1040, an output component 1050, and/or a communication component 1060.

The bus 1010 may include one or more components that enable wired and/or wireless communication among the components of the device 1000. The bus 1010 may couple together two or more components of FIG. 10, such as via operative coupling, communicative coupling, electronic coupling, and/or electric coupling. For example, the bus 1010 may include an electrical connection, a wire, a trace, a lead, and/or a wireless bus. The processor 1020 may include a central processing unit, a graphics processing unit, a microprocessor, a controller, a microcontroller, a digital signal processor, a field-programmable gate array, an application-specific integrated circuit, and/or another type of processing component. The processor 1020 may be implemented in hardware, firmware, or a combination of hardware and software. In some implementations, the processor 1020 may include one or more processors capable of being programmed to perform one or more operations or processes described elsewhere herein.

The memory 1030 may include volatile and/or nonvolatile memory. For example, the memory 1030 may include random access memory (RAM), read only memory (ROM), a hard disk drive, and/or another type of memory (e.g., a flash memory, a magnetic memory, and/or an optical memory). The memory 1030 may include internal memory (e.g., RAM, ROM, or a hard disk drive) and/or removable memory (e.g., removable via a universal serial bus connection). The memory 1030 may be a non-transitory computer-readable medium. The memory 1030 may store information, one or more instructions, and/or software (e.g., one or more software applications) related to the operation of the device 1000. In some implementations, the memory 1030 may include one or more memories that are coupled (e.g., communicatively coupled) to one or more processors (e.g., processor 1020), such as via the bus 1010. Communicative coupling between a processor 1020 and a memory 1030 may enable the processor 1020 to read and/or process information stored in the memory 1030 and/or to store information in the memory 1030.

The input component 1040 may enable the device 1000 to receive input, such as user input and/or sensed input. For example, the input component 1040 may include a touch screen, a keyboard, a keypad, a mouse, a button, a microphone, a switch, a sensor, a global positioning system sensor, an accelerometer, a gyroscope, and/or an actuator. The output component 1050 may enable the device 1000 to provide output, such as via a display, a speaker, and/or a light-emitting diode. The communication component 1060 may enable the device 1000 to communicate with other devices via a wired connection and/or a wireless connection. For example, the communication component 1060 may include a receiver, a transmitter, a transceiver, a modem, a network interface card, and/or an antenna.

The device 1000 may perform one or more operations or processes described herein. For example, a non-transitory computer-readable medium (e.g., memory 1030) may store a set of instructions (e.g., one or more instructions or code) for execution by the processor 1020. The processor 1020 may execute the set of instructions to perform one or more operations or processes described herein. In some implementations, execution of the set of instructions, by one or more processors 1020, causes the one or more processors 1020 and/or the device 1000 to perform one or more operations or processes described herein. In some implementations, hardwired circuitry may be used instead of or in combination with the instructions to perform one or more operations or processes described herein. Additionally, or alternatively, the processor 1020 may be configured to perform one or more operations or processes described herein. Thus, implementations described herein are not limited to any specific combination of hardware circuitry and software.

The number and arrangement of components shown in FIG. 10 are provided as an example. The device 1000 may include additional components, fewer components, different components, or differently arranged components than those shown in FIG. 10. Additionally, or alternatively, a set of components (e.g., one or more components) of the device 1000 may perform one or more functions described as being performed by another set of components of the device 1000.

Figure 11:
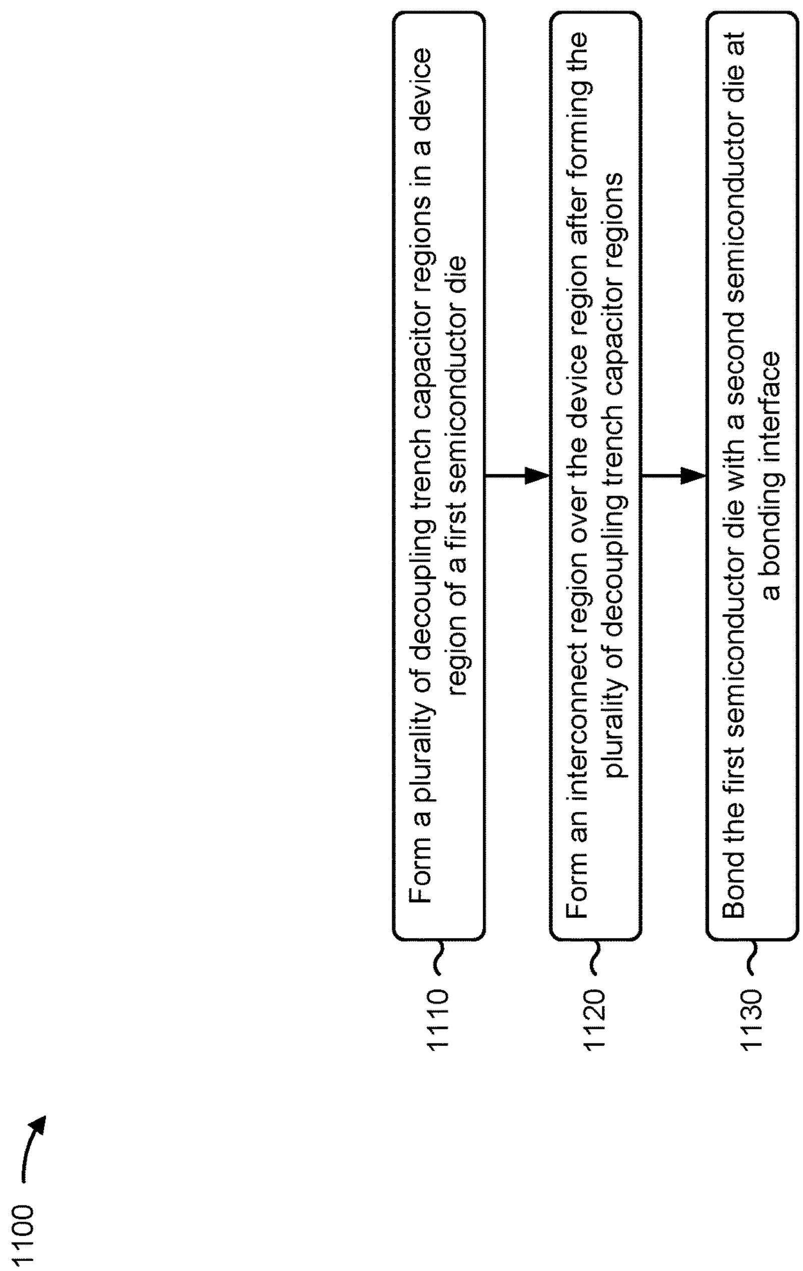
FIG. 11 is a flowchart of an example process associated with forming a semiconductor die package described herein.

FIG. 11 is a flowchart of an example process 1100 associated with forming a semiconductor die package described herein. In some implementations, one or more process blocks of FIG. 11 are performed by a one or more semiconductor processing tools (e.g., one or more of the semiconductor processing tools 102-114). Additionally, or alternatively, one or more process blocks of FIG. 11 may be performed by one or more components of device 1000, such as processor 1020, memory 1030, input component 1040, output component 1050, and/or communication component 1060.

As shown in FIG. 11, process 1100 may include forming a plurality of decoupling trench capacitor regions in a device region of a first semiconductor die (block 1110). For example, one or more of the semiconductor processing tools 102-114 may form a plurality of decoupling trench capacitor regions 204*a*-204*n* in a device region 214 of a first semiconductor die 202, as described herein. In some implementations, a first plurality of decoupling trench capacitor structures 220*a*, of a first decoupling trench capacitor region 204*a* of the plurality of decoupling trench capacitor regions 204*a*-204*n*, are formed to a first depth (D1) in the device region 214. In some implementations, a second plurality of decoupling trench capacitor structures 220*b*, of a second decoupling trench capacitor region 204*c* of the plurality of decoupling trench capacitor regions 204*a*-204*n*, are formed to a second depth (D2) in the device region. In some implementations, the first depth (D1) and the second depth (D2) are different depths relative to a surface 246 of the device region 214.

As further shown in FIG. 11, process 1100 may include forming an interconnect region over the device region after forming the plurality of decoupling trench capacitor regions (block 1120). For example, one or more of the semiconductor processing tools 102-114 may form an interconnect region 216 over the device region 214 after forming the plurality of decoupling trench capacitor regions 204*a*-204*n*, as described herein.

As further shown in FIG. 11, process 1100 may include bonding the first semiconductor die with a second semiconductor die at a bonding interface (block 1130). For example, one or more of the semiconductor processing tools 102-114 may bond the first semiconductor die 202 with a second semiconductor die 206 at a bonding interface 208, as described herein.

Process 1100 may include additional implementations, such as any single implementation or any combination of implementations described below and/or in connection with one or more other processes described elsewhere herein.

In a first implementation, bonding the first semiconductor die 202 and the second semiconductor die 206 includes performing a bonding operation to bond the first semiconductor die 202 and the second semiconductor die 206.

In a second implementation, alone or in combination with the first implementation, process 1100 includes forming a plurality of semiconductor devices 218 in another device region 210 of the second semiconductor die 206, and forming another interconnect region 212 over the other device region 210, where the first plurality of decoupling trench capacitor structures 220*a* and the second plurality of decoupling trench capacitor structures 220*b* are configured to provide a decoupling capacitance for the plurality of semiconductor devices 218 of the second semiconductor die 206.

In a third implementation, alone or in combination with one or more of the first and second implementations, process 1100 includes forming a first portion 302*b* of a seal ring structure 302 in the first semiconductor die 202, and forming a second portion 302*a* of the seal ring structure 302 in the second semiconductor die, where the first portion 302*b* of the seal ring structure 302 and the second portion 302*a* of the seal ring structure 302 are joined at the bonding interface 208 when the first semiconductor die 202 and the second semiconductor die 204 are bonded.

In a fourth implementation, alone or in combination with one or more of the first through third implementations, forming the first portion 302*b* of the seal ring structure 302 includes forming a portion 304*b* of an inner seal ring structure 304 of the seal ring structure 302 in the first semiconductor die 202, and forming a portion 306*b* of an outer seal ring structure 306 of the seal ring structure 302 in the first semiconductor die 202.

In a fifth implementation, alone or in combination with one or more of the first through fourth implementations, process 1100 includes forming, in the interconnect region 216, a metallization layer 308 that electrically connects the first portion 302*b* of the seal ring structure 302 with a third plurality of decoupling trench capacitor structures 220 in a third decoupling trench capacitor region 204*b* of the plurality of decoupling trench capacitor regions 204*a*-204*n*.

In a sixth implementation, alone or in combination with one or more of the first through fifth implementations, process 1100 includes forming an ESD protection circuit 312 in the second semiconductor die 206, where the ESD protection circuit 312 is electrically connected with the second portion 302*a* of the seal ring structure 302.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

In this way, a semiconductor die included in a semiconductor die package may include a plurality of decoupling trench capacitor regions in a device region of the semiconductor die. At least two or more of the decoupling trench capacitor regions include decoupling trench capacitor structures having different depths. The depths of the decoupling trench capacitor structures in the decoupling trench capacitor regions may be selected to provide sufficient capacitance so as to satisfy circuit decoupling parameters for circuits of the semiconductor die package, while reducing the likelihood of warping, breaking, and/or cracking of the semiconductor die package.

As described in greater detail above, some implementations described herein provide a semiconductor die package. The semiconductor die package includes a first semiconductor die. The first semiconductor die includes a first device region that includes a first decoupling trench capacitor region including a first decoupling trench capacitor structure and a second decoupling trench capacitor region including a second decoupling trench capacitor structure, where a first height of the first decoupling trench capacitor structure in the first decoupling capacitor region, and a second height of a second decoupling trench capacitor structures in the second decoupling capacitor region, are different heights. The first semiconductor die includes a first interconnect region vertically adjacent to the first device region at a first side of the first interconnect region and including a plurality of metallization layers that are electrically connected with the first and second decoupling trench capacitor structures. The semiconductor die package includes a second semiconductor die, bonded with the first semiconductor die at a second side of the first interconnect region opposing the first side. The second semiconductor die includes a second device region including one or more semiconductor devices and a second interconnect region vertically adjacent to the second device region.

As described in greater detail above, some implementations described herein provide a method. The method includes forming a plurality of decoupling trench capacitor regions in a device region of a first semiconductor die. A first plurality of decoupling trench capacitor structures, of a first decoupling trench capacitor region of the plurality of decoupling trench capacitor regions, are formed to a first depth in the device region. A second plurality of decoupling trench capacitor structures, of a second decoupling trench capacitor region of the plurality of decoupling trench capacitor regions, are formed to a second depth in the device region. The first depth and the second depth are different depths relative to a surface of the device region. The method includes forming an interconnect region over the device region after forming the plurality of decoupling trench capacitor regions. The method includes bonding the first semiconductor die with a second semiconductor die at a bonding interface.

As described in greater detail above, some implementations described herein provide a semiconductor die package. The semiconductor die package includes a first semiconductor die. The first semiconductor die includes a first device region that includes a first decoupling trench capacitor region including a first decoupling trench capacitor structure and a second decoupling trench capacitor region including a second decoupling trench capacitor structure. The first semiconductor die includes a first interconnect region vertically adjacent to the first device region at a first side of the first interconnect region. The semiconductor die package includes a second semiconductor die, bonded with the first semiconductor die at a second side of the first interconnect region opposing the first side. The second semiconductor die includes a second device region that includes one or more semiconductor devices and an ESD protection circuit. The second semiconductor die includes a second interconnect region vertically adjacent to the second device region. The semiconductor die package includes a seal ring structure that extends through the first interconnect region and the second interconnect region, where the seal ring structure electrically connects the ESD protection circuit with the first and second decoupling trench capacitor structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die package, comprising:

a first semiconductor die, comprising:

a first device region that includes a first decoupling trench capacitor region including a first decoupling trench capacitor structure and a second decoupling trench capacitor region including a second decoupling trench capacitor structure, wherein a first height of the first decoupling trench capacitor structure in the first decoupling trench capacitor region, and a second height of a second decoupling trench capacitor structures in the second decoupling capacitor region, are different heights; and a first interconnect region vertically adjacent to the first device region at a first side of the first interconnect region and including a plurality of metallization layers that are electrically connected with the first and second decoupling trench capacitor structures; and a second semiconductor die, bonded with the first semiconductor die at a second side of the first interconnect region opposing the first side, comprising:

a second device region including one or more semiconductor devices; and a second interconnect region vertically adjacent to the second device region.

2. The semiconductor die package of claim 1, wherein the first and second decoupling trench capacitor structures of the first semiconductor die are configured to provide a decoupling capacitance for the one or more semiconductor devices of the second semiconductor die.

3. The semiconductor die package of claim 1, wherein the first height and the second height are relative to a bottom surface of a semiconductor substrate of the first device region;

wherein the first height corresponds to a first depth of the first decoupling trench capacitor structure in the semiconductor substrate relative to the bottom surface; and wherein the second height corresponds to a second depth of the second decoupling trench capacitor structure in the semiconductor substrate relative to the bottom surface.

4. The semiconductor die package of claim 1, wherein a third height of a third decoupling trench capacitor structure in a third decoupling trench capacitor region of the first device region is different from the first height and the second height.

5. The semiconductor die package of claim 4, wherein the first height and the third height are included in a range of approximately 15% less than the second height to approximately 15% greater than the second height.

6. The semiconductor die package of claim 1, wherein the second decoupling trench capacitor structure in the second decoupling capacitor region is located closer to an outer edge of the semiconductor die package relative to the first decoupling trench capacitor structure in the first decoupling trench capacitor region; and wherein the second height is greater relative to the first height.

7. The semiconductor die package of claim 1, wherein a first width of the first decoupling trench capacitor structure in the first decoupling capacitor region, and a second width of the second decoupling trench capacitor structure in the second decoupling trench capacitor region, are different widths.

8. The semiconductor die package of claim 7, wherein the second height is greater relative to the first height; and wherein the second width is greater relative to the first width.

9. The semiconductor die package of claim 8, wherein the second decoupling trench capacitor structure includes a greater quantity of conductive layers and a greater quantity of dielectric layers relative to the first decoupling trench capacitor structure.

10. A method, comprising:

forming a plurality of decoupling trench capacitor regions in a device region of a first semiconductor die, wherein a first plurality of decoupling trench capacitor structures, of a first decoupling trench capacitor region of the plurality of decoupling trench capacitor regions, are formed to a first depth in the device region, wherein a second plurality of decoupling trench capacitor structures, of a second decoupling trench capacitor region of the plurality of decoupling trench capacitor regions, are formed to a second depth in the device region, and wherein the first depth and the second depth are different depths relative to a surface of the device region;

forming an interconnect region over the device region after forming the plurality of decoupling trench capacitor regions; and bonding the first semiconductor die with a second semiconductor die at a bonding interface.

11. The method of claim 10, wherein bonding the first semiconductor die and the second semiconductor die comprises:

performing a direct bonding operation to bond the first semiconductor die and the second semiconductor die.

12. The method of claim 10, further comprising:

forming a plurality of semiconductor devices in another device region of the second semiconductor die; and forming another interconnect region over the other device region, wherein the first plurality of decoupling trench capacitor structures and the second plurality of decoupling trench capacitor structures are configured to provide a decoupling capacitance for the plurality of semiconductor devices of the second semiconductor die.

13. The method of claim 10, further comprising:

forming a first portion of a seal ring structure in the first semiconductor die; and forming a second portion of the seal ring structure in the second semiconductor die, wherein the first portion of the seal ring structure and the second portion of the seal ring structure are joined at the bonding interface when the first semiconductor die and the second semiconductor die are bonded.

14. The method of claim 13, wherein forming the first portion of the seal ring structure comprises:

forming a portion of an inner seal ring structure of the seal ring structure in the first semiconductor die; and forming a portion of an outer seal ring structure of the seal ring structure in the first semiconductor die.

15. The method of claim 13, further comprising:

forming, in the interconnect region, a metallization layer that electrically connects the first portion of the seal ring structure with a third plurality of decoupling trench capacitor structures in a third decoupling trench capacitor region of the plurality of decoupling trench capacitor regions.

16. The method of claim 13, further comprising:

forming an electrostatic discharge (ESD) protection circuit in the second semiconductor die, wherein the ESD protection circuit is electrically connected with the second portion of the seal ring structure.

17. A semiconductor die package, comprising:

a first semiconductor die, comprising:

a first device region that includes a first decoupling trench capacitor region including a first decoupling trench capacitor structure and a second decoupling trench capacitor region including a second decoupling trench capacitor structure;

a first interconnect region vertically adjacent to the first device region at a first side of the first interconnect region;

a second semiconductor die, bonded with the first semiconductor die at a second side of the first interconnect region opposing the first side, comprising:

a second device region including:

one or more semiconductor devices; and an electrostatic discharge (ESD) protection circuit; and a second interconnect region vertically adjacent to the second device region; and a seal ring structure that extends through the first interconnect region and the second interconnect region, wherein the seal ring structure electrically connects the ESD protection circuit with the first and second decoupling trench capacitor structures.

18. The semiconductor die package of claim 17, wherein the seal ring structure comprises:

an inner seal ring structure; and an outer seal ring structure, wherein the inner seal ring structure, of the seal ring structure, electrically connects the ESD protection circuit with the first and second decoupling trench capacitor structures.

19. The semiconductor die package of claim 17, wherein the one or more semiconductor devices and the ESD protection circuit are electrically connected by one or more metallization layers in the second interconnect region.

20. The semiconductor die package of claim 17, wherein a first height of the first decoupling trench capacitor structure in the first decoupling trench capacitor region, and a second height of the second decoupling trench capacitor structure in the second decoupling trench capacitor region, are different heights.

* * * * *